United States Patent
Yang et al.

(10) Patent No.: US 12,406,928 B2
(45) Date of Patent: Sep. 2, 2025

(54) THREE-DIMENSIONAL MEMORY DEVICES AND FABRICATING METHODS THEREOF

(71) Applicant: Yangtze Memory Technologies Co., Ltd., Hubei (CN)

(72) Inventors: Yuancheng Yang, Hubei (CN); Dongxue Zhao, Hubei (CN); Tao Yang, Hubei (CN); Lei Liu, Hubei (CN); Di Wang, Hubei (CN); Kun Zhang, Hubei (CN); Wenxi Zhou, Hubei (CN); Zhiliang Xia, Hubei (CN); Zongliang Huo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 613 days.

(21) Appl. No.: 17/738,715

(22) Filed: May 6, 2022

(65) Prior Publication Data
US 2023/0361030 A1    Nov. 9, 2023

(51) Int. Cl.
H01L 23/528    (2006.01)
H10B 41/20    (2023.01)
H10B 43/20    (2023.01)

(52) U.S. Cl.
CPC ........ H01L 23/5283 (2013.01); H10B 41/20 (2023.02); H10B 43/20 (2023.02)

(58) Field of Classification Search
CPC ......... H10B 41/20; H10B 43/20; H10B 12/20
See application file for complete search history.

(56) References Cited

U.S. PATENT DOCUMENTS

| | | | |
|---|---|---|---|
| 2016/0204117 A1* | 7/2016 | Liu | H10D 30/0411 257/324 |
| 2022/0052073 A1* | 2/2022 | Kitazawa | H10B 43/27 |
| 2023/0282576 A1* | 9/2023 | Yang | G11C 11/4045 |

FOREIGN PATENT DOCUMENTS

CN    114005825 A  *  2/2022

OTHER PUBLICATIONS

CN 114005825 A, original patent publication and machine translation (Year: 2022).*

* cited by examiner

*Primary Examiner* — Erik Kielin
(74) *Attorney, Agent, or Firm* — Conley Rose, P.C.

(57) ABSTRACT

Embodiments of three-dimensional memory devices and fabricating methods thereof are disclosed. One disclosed method for forming a memory structure comprises: forming a bottom conductive layer on a substrate; forming a memory stack on the bottom conductive layer, the memory stack comprising a plurality of alternatively arranged dielectric layers and conductive layers; forming an opening penetrating the memory stack and exposing the bottom conductive layer; forming a cap layer on a bottom of the opening; forming a cylindrical body and a top contact on the cap layer and in the opening; and forming a plurality of interconnection structures to electrically connect the bottom conductive layer, the plurality of conductive layers of the memory stack, and the top contact.

15 Claims, 25 Drawing Sheets ns and fabrication techniques become challenging and costly. A three-dimensional (3D) memory architecture can address the density limitation in planar memory cells.

THREE-DIMENSIONAL MEMORY DEVICES AND FABRICATING METHODS THEREOF

TECHNICAL FIELD

The present disclosure relates to field of semiconductor technology, and more particularly, to three-dimensional memory devices, such as dynamic flash memory (DFM) devices, and fabricating methods thereof.

BACKGROUND

Planar memory cells are scaled to smaller sizes by improving process technology, circuit designs, programming algorithms, and fabrication processes. However, as feature sizes of the memory cells approach a lower limit, planar processes and fabrication techniques become challenging and costly. A three-dimensional (3D) memory architecture can address the density limitation in planar memory cells.

A dynamic random access memory (DRAM) is a type of random access semiconductor memory that can store each bit of data in a memory cell. Certain types of memory cells include a capacitor and an array transistor, also referred to as a 1T1C memory structure. The capacitor can be set to either a charged or discharged state, representing the bit value of zero and one, respectively. As DRAM technology progresses towards higher device densities and higher storage capacities, current 1T1C DRAM is approaching a process limit. The manufacturing of 1T1C DRAM devices with small-node capacitors to retain charge is becoming more difficult due to increased current leakage, increased power consumption, degraded operating voltage margins, and decreased retention times.

There is a need for a capacitor-less or capacitor-free DRAM to replace the traditional 1T1C structure to continuous scaling down of DRAM. Capacitor-free one transistor memory structures, also referred to as 1T memory structures, such as ZRAM, TTRAM, ARAM, etc., have been developed to improve device density and storage capacities. However, capacitor-less one transistor memory structures face challenges and need further improvement and optimization for manufacturable integration and operation solutions.

BRIEF SUMMARY

Aspects of three-dimensional memory devices and fabricating methods thereof are described in the present disclosure.

One aspect of the present disclosure provides a method for forming a memory structure, comprising: forming a bottom conductive layer on a substrate; forming a memory stack on the bottom conductive layer, the memory stack comprising a plurality of alternatively arranged dielectric layers and conductive layers; forming an opening penetrating the memory stack and exposing the bottom conductive layer; forming a cap layer on a bottom of the opening; forming a cylindrical body and a top contact on the cap layer and in the opening; and forming a plurality of interconnection structures to electrically connect the bottom conductive layer, the plurality of conductive layers of the memory stack, and the top contact.

In some embodiments, the method further comprises doping the bottom conductive layer and the cap layer with a first type of dopant.

In some embodiments, the method further comprises, before forming the cylindrical body and the top contact, performing an oxidation process to treat exposed surface of the plurality of conductive layers of the memory stack and the bottom conductive layer to form an oxide layer.

In some embodiments, the method further comprises, before forming the cylindrical body and the top contact, performing a punch etch to remove the oxide layer on the bottom conductive layer to expose the conductive layer.

In some embodiments, forming the cylindrical body and the top contact comprises: forming a semiconductor structure on the cap layer to fill the opening; doping the semiconductor structure with a second type of dopant opposite to the first type of dopant; and doping a top portion of the semiconductor structure with the first type of dopant, such that the top portion of the semiconductor structure form the top contact, and the remaining portion of the semiconductor structure form the cylindrical body.

In some embodiments, forming the semiconductor structure comprises: forming the semiconductor material in the opening by a patterned epitaxial growth process.

In some embodiments, the method further comprises, forming the semiconductor structure comprises: forming the semiconductor material in the opening by a deposition process and a followed recrystallization process.

In some embodiments, forming the cap layer comprises: using an cyclic deposition-etch process to form the cap layer, such that a top surface of the cap layer is lower than a bottom surface of a lowest conductive layer of the memory stack.

In some embodiments, the method further comprises forming a plurality of interconnection structures electrically connected to the top contact, the plurality of conductive layers of the memory stack, and the bottom conductive layer respectively.

In some embodiments, the method further comprises: forming a staircase structure in the memory stack; wherein the interconnection structures electrically connected to the plurality of conductive layers of the memory stack are formed on the staircase structure.

In some embodiments, forming the plurality of interconnection structures comprises: connecting the top contact to a bit line; connecting a top conductive layer of the memory stack is coupled to a word line; connecting the plurality conductive layers other than the top conductive layer of the memory stack to a plurality of plate lines respectively; and connecting the bottom conductive layer to a source line.

In some embodiments, the method further comprises connecting the plurality of plate lines to a common voltage source.

In some embodiments, the method further comprises connecting the plurality of plate lines to a plurality of independent voltage sources.

In some embodiments, forming the memory stack comprises: depositing the plurality of conductive layers, such that each of the plurality of conductive layers of the memory stack has a substantially same first thickness.

In some embodiments, forming the memory stack further comprises: depositing the plurality of dielectric layers, such that each of the plurality of dielectric layers of the memory stack has a substantially same second thickness.

In some embodiments, forming the memory stack further comprises: depositing the plurality of dielectric layers, such that a top dielectric layer of the memory stack has a third thickness that is different from a second thickness of the other dielectric layers of the memory stack.

Another aspect of the present disclosure provides a method for forming a memory structure, comprising: forming a memory cell comprising: forming a cylindrical body configured to store an electrical charge, forming an insulating layer surrounding the cylindrical body, forming a word line contact surrounding a first portion of the insulating layer, the word line contact coupled to a word line, and forming a plurality of plate line contact segments surrounding a second portion of the insulating layer, the plurality of plate line contact segments coupled to a plurality of plate lines respectively; forming a bit line contact coupled to a first end of the cylindrical body of the memory cell, the bit line contact coupled to a bit line; forming a source cap coupled to a second end of the cylindrical body of the memory cell; and forming a source line contact coupled to the source cap, the source line contact coupled to a source line.

In some embodiments, the method further comprises connecting the plurality of plate lines to a common voltage source.

In some embodiments, the method further comprises connecting the plurality of plate lines to a plurality of independent voltage sources.

Implementations of any of the techniques described above may include a system, a method, a process, a device, and/or an apparatus. The details of one or more implementations are set forth in the accompanying drawings and the description below. Other features will be apparent from the description and drawings, and from the claims.

Further features and exemplary aspects of the aspects, as well as the structure and operation of various aspects, are described in detail below with reference to the accompanying drawings. It is noted that the aspects are not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the aspects and, together with the description, further serve to explain the principles of the aspects and to enable a person skilled in the relevant art(s) to make and use the aspects.

Figure 1:
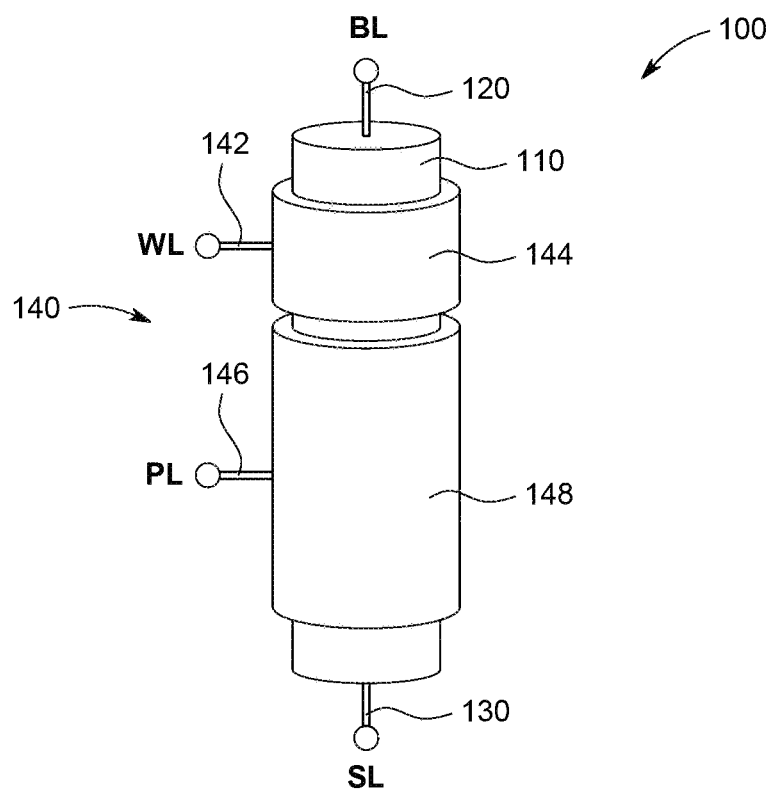
FIG. 1 is a schematic perspective illustration of a dual-gate SGT device, according to some exemplary aspects.

The features and exemplary aspects of the aspects will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more aspects that incorporate the features of this present invention. The disclosed aspect(s) merely exemplify the present invention. The scope of the invention is not limited to the disclosed aspect(s). The present invention is defined by the claims appended hereto.

The aspect(s) described, and references in the specification to "one aspect," "an aspect," "an example aspect," "some exemplary aspects," etc., indicate that the aspect(s) described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of one skilled in the art to effect such feature, structure, or characteristic in connection with other aspects whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

The term "dynamic random-access memory" or "DRAM" as used herein indicates a volatile memory that uses charge stored on a capacitor to represent information. DRAM stores each bit in a memory cell that includes a transistor and a capacitor (e.g., 1T1C). The 1T1C design can be based on metal-oxide-semiconductor (MOS) technology. Charge levels greater than a certain threshold can represent a first logic level (e.g., 1 state) and charge levels less than another threshold amount can represent a second logic level (e.g., 0 state). Leakage currents and various parasitic effects limit the length of time a capacitor can hold charge.

The term "NAND" as used herein indicates memory designs or architectures that resemble NAND logic gates (e.g., an inverted AND gate) and connect to memory cells in series (e.g., memory strings). In NAND flash, the relationship between a bit line and a word line resembles a NAND logic gate and can be used for fast writes and high-density arrays. NAND flash can access data sequentially since the transistors in the array are connected in series (e.g., memory strings). NAND flash can be read, programmed (written), and erased in blocks or pages. NAND flash can have a smaller cell size than DRAM but can require additional circuitry to implement.

The term "surrounding gate transistor" or "SGT" as used herein indicates a memory device that has a gate surrounding a channel region of a transistor on all sides.

The term "dynamic flash memory" or "DFM" as used herein indicates a volatile memory that uses a dual-gate SGT or a multi-gate SGT. The dual gates of the dual-gate SGT can include a word line (WL) gate and a plate line (PL) gate. The plurality of gates of the multi-gate SGT can include a word line (WL) gate and multiple plate line (PL) gates. DFM can be capacitor-free and can store charge on a channel region of a transistor. DFM can still requires a refresh cycle but can offer longer retention times, faster operation speeds, and higher density than compared to DRAM or other types of volatile memory. Further, similar to flash, DFM can offer block refresh and block erase operations.

The term "bit line" or "BL" as used herein indicates an array connection to address a particular memory cell in a memory array. A bit line can be connected to a drain of a transistor (e.g., DFM device). A bit line can be connected to two or more serially connected memory cells (e.g., memory strings). Different voltage combinations applied to the bit line can define read, program (write), and erase operations in the memory cell.

The term "source line" or "SL" as used herein indicates an array connection to address a particular memory cell in a memory array. A source line can be connected to a source of a transistor (e.g., DFM device). A source line can be connected to two or more serially connected memory cells (e.g., memory strings). Different voltage combinations applied to the source line can define read, program (write), and erase operations in the memory cell.

The term "word line" or "WL" as used herein indicates an array connection to provide a voltage to a particular memory cell in a memory array to select which row of bits is to be read, programmed, or erased. A word line can act as a top select gate (TSG). A word line can be connected to a portion of a channel or a portion of a body of a transistor (e.g., DFM device). Different voltage combinations applied to the word line can define read, program (write), and erase operations in the memory cell. When the word line is activated, current flows only if charge is already on the memory cell. If there is charge on the channel or body of the memory cell, the read operation recharges the memory cell and is non-destructive. If there is no charge on the channel or body of the memory cell, no current flows and the read is also non-destructive.

The term "plate line" or "PL" as used herein indicates an array connection to provide a voltage to a particular memory cell in a memory array to read, program, or erase charge on the memory cell. A plate line can be connected to a portion of a channel or a portion of a body of a transistor (e.g., DFM device). Different voltage combinations applied to the plate line can define read, program (write), and erase operations in the memory cell. When the plate line is activated, charge flows from the source line (source) to the bit line (drain). When the plate line is deactivated, any remaining charge is stored in the channel or body of the memory cell.

The term "dummy line" or "DMY" as used herein indicates an array connection, separate from a word line, to provide an additional voltage to a particular memory cell in a memory array to increase operating efficiency. A dummy line can be used for impact ionization programming to rapidly increase charge (e.g., holes) conduction generated at a word line contact to flow and increase charge (e.g., holes) in a channel of a memory cell. A dummy line can increase a program (write) rate of a memory cell.

The term "top select gate line" or "TSG" as used herein indicates an array connection to provide a voltage to a particular memory cell in a memory array to select which row of bits is to be read, programmed, or erased. The top select gate line can be used for gate-induced drain leakage (GIDL) programming to create a charge (e.g., hole) barrier to provide selective programming (writing) in a channel of a memory cell. A top select gate line can provide selective programming (writing) and increase a program (write) rate. A top select gate line can provide charge separation between a plate line and a bit line and thereby increase charge retention times and decrease refresh rates in a memory cell. A top select gate line can provide charge separation between a plate line and a bit line and thereby decrease junction leakage. A top select gate line can increase a depletion area of a memory cell.

The term "bottom select gate line" or "BSG" as used herein indicates an array connection to provide a voltage to a particular memory cell in a memory array to select which row of bits is to be read, programmed, or erased. The bottom select gate line can be used for gate-induced source leakage (GISL) programming to create a charge (e.g., hole) barrier to provide selective programming (writing) in a channel of a memory cell. A bottom select gate line can provide selective programming (writing) and increase a program (write) rate. A bottom select gate line can provide charge separation between a plate line and a source line and thereby increase charge retention times and decrease refresh rates in a memory cell. A bottom select gate line can provide charge separation between a plate line and a source line and thereby decrease junction leakage. A bottom select gate line can increase a depletion area of a memory cell.

The term "impact ionization" or "collision ionization" as used herein indicates a programming method to generate electrical charge on a channel through interactions or collisions with charge carriers (e.g., holes). Impact ionization is a carrier generation process by which one energetic charge carrier loses energy through the creation of other charge carriers. For example, an electron with sufficient energy can release a bound electron in the valence band of the semiconductor material to the conduction band thereby creating an electron-hole pair.

The term "gate-induced drain leakage" or "GIDL" as used herein indicates a programming method to generate electrical charge on a channel through drain leakage. GIDL is caused by high electric fields in a drain junction of a memory cell. When a gate is at zero or negative voltage and a bit line has a positive voltage (e.g., above a threshold voltage), various charge generation effects (e.g., avalanche multiplication, band-to-band tunneling) will increase. For example, band-to-band tunneling can occur at the drain-channel junction of the memory cell. Minority carriers (e.g., holes) underneath the gate can flow to the source line to complete the GIDL path.

The term "gate-induced source leakage" or "GISL" as used herein indicates a programming method to generate electrical charge on a channel through source leakage. GISL is caused by high electric fields in a source junction of a memory cell. When a gate is at zero or negative voltage and a source line has a positive voltage (e.g., above a threshold voltage), various charge generation effects (e.g., avalanche multiplication, band-to-band tunneling) will increase. For example, band-to-band tunneling can occur at the source-channel junction of the memory cell. Minority carriers (e.g., holes) underneath the gate can flow to the drain (bit) line to complete the GISL path.

The term "substrate" as used herein indicates a planar wafer on which subsequent layers can be deposited, formed, or grown. A substrate can be formed of a single element (e.g., Si) or a compound material (e.g., GaAs), and may be doped or undoped. For example, a substrate can include silicon (Si), germanium (Ge), silicon-germanium (SiGe), gallium arsenide (GaAs), gallium nitride (GaN), gallium phosphide (GaP+), gallium antimonide (GaSb), indium phosphide (InP+), indium antimonide (InSb), a Group IV semiconductor, a Group III-V semiconductor, a Group II-VI semiconductor, graphene, sapphire, and/or any other semiconductor material. A substrate can be a monocrystalline material (e.g., monocrystalline Si).

The term "Group III-V semiconductor" as used herein indicates comprising one or more materials from Group III of the periodic table (e.g., group 13 elements: boron (B), aluminum (Al), gallium (Ga), indium (In), thallium (Tl)) with one or more materials from Group V of the periodic table (e.g., group 15 elements: nitrogen (N), phosphorus (P+), arsenic (As), antimony (Sb), bismuth (Bi)). The compounds have a 1:1 combination of Group III and Group V regardless of the number of elements from each group. Subscripts in chemical symbols of compounds refer to the proportion of that element within that group. For example, $Al_{0.25}GaAs$ means the Group III part comprises 25% Al, and thus 75% Ga, while the Group V part comprises 100% As.

The term "Group IV semiconductor" as used herein indicates comprising two or more materials from Group IV of the periodic table (e.g., group 14 elements: carbon (C), silicon (Si), germanium (Ge), tin (Sn), lead (Pb)). Subscripts in chemical symbols of compounds refer to the proportion of that element. For example, $Si_{0.25}Ge_{0.75}$ means the Group IV part comprises 25% Si, and thus 75% Ge.

The term "Group II-VI semiconductor" as used herein indicates comprising one or more materials from Group II of the periodic table (e.g., group 12 elements: zinc (Zn), cadmium (Cd), mercury (Hg)) with one or more materials from Group VII of the periodic table (e.g., group 16 elements: oxygen (O), sulfur (S), selenium (Se), tellurium (Te)). The compounds have a 1:1 combination of Group II and Group VI regardless of the number of elements from each group. Subscripts in chemical symbols of compounds refer to the proportion of that element within that group.

The term "doping" or "doped" as used herein indicates that a layer or material contains a small impurity concentration of another element (dopant) which donates (donor) or extracts (acceptor) charge carriers from the parent material and therefore alters the conductivity. Charge carriers may be electrons or holes. A doped material with extra electrons is called n-type while a doped material with extra holes (fewer electrons) is called p-type.

The term "crystalline" as used herein indicates a material or layer with a single crystal orientation. In epitaxial growth or deposition, subsequent layers with the same or similar lattice constant follow the registry of the previous crystalline layer and therefore grow with the same crystal orientation or crystallinity.

The term "monocrystalline" as used herein indicates a material or layer having a continuous crystal lattice throughout the material or layer. Monocrystalline can indicate a single crystal or monocrystal (e.g., Si, Ge, GaAs, etc.).

The term "monolithic" as used herein indicates a layer, element, or substrate comprising bulk (e.g., single) material throughout. A monolithic element (e.g., a cylindrical body) can be formed from a single bulk material (e.g., Si).

The term "deposit" or "deposition" as used herein indicates the depositing or growth of a layer on another layer or substrate. Deposition can encompass vacuum deposition, thermal evaporation, arc vaporization, ion beam deposition, e-beam deposition, sputtering, laser ablation, pulsed laser deposition (PLD), physical vapor deposition (PVD), atomic layer deposition (ALD), chemical vapor deposition (CVD), plasma-enhanced CVD (PECVD), low pressure CVD (LPCVD), metal-organic chemical vapor deposition (MOCVD), liquid source misted chemical deposition, spin-coating, epitaxy, vapor-phase epitaxy (VPE), liquid-phase epitaxy (LPE), solid-phase epitaxy (SPE), MBE, atomic layer epitaxy (ALE), molecular-beam epitaxy (MBE), powder bed deposition, and/or other known techniques to deposit material in a layer.

The term "dielectric" as used herein indicates an electrically insulating layer. Dielectric can encompass oxide, nitride, oxynitride, ceramic, glass, spin-on-glass (SOG), polymer, plastic, thermoplastic, resin, laminate, high-k dielectric, and/or any other electrically insulating material.

The term "high-k dielectric" as used herein indicates a material with a high dielectric constant k or κ (kappa), for example, relative to the dielectric constant of silicon dioxide (Sift). High-k dielectrics can be used as a gate dielectric or as another dielectric layer in an electronic device.

The term "high-k metal gate" or "high-k dielectric and conductive gate" or "HKMG" as used herein indicates a process of forming a high-k dielectric layer and a conductive (metal) layer stack in a memory device. HKMG technology can reduce gate leakage, increase transistor capacitance, and provide low power consumption for devices. Two process flows to pattern the HKMG stack are gate-first and gate-last.

The term "epitaxy" or "epitaxial" or "epitaxially" as used herein indicates crystalline growth of material, for example, via high temperature deposition.

The term "selective epitaxial growth" or "SEG" as used herein indicates local growth of an epitaxial layer through a pattern mask on a substrate or a layer. SEG provides epitaxial growth only on the exposed substrate or layer and other regions are masked by a dielectric film or other material that is not reactive to epitaxy.

The term "dielectric stack" as used herein indicates a stack of different alternating dielectric layers in succession. For example, the first dielectric layer can be an oxide (e.g., silicon oxide) and the second dielectric layer can be a nitride (e.g., silicon nitride). The dielectric stack can be arranged in a staircase pattern.

The term "gate line trench" as used herein indicates a trench or hole extending through an dielectric stack of a memory device. The gate line trench can be used to form a gate line slit in the memory device.

The term "gate line slit" or "GLS" as used herein indicates a conductive pathway through an dielectric stack, for example, between adjacent memory blocks or adjacent memory cells. The GLS can provide connection to a HKMG stack in a memory device. The GLS can extend vertically through the dielectric stack and extend horizontally between two adjacent arrays of memory blocks or memory cells.

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; dynamic flash memory (DFM) devices, electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Various aspects in accordance with the present disclosure provide structures and fabricating methods for capacitor-less or capacitor-free multi-gate vertical 1T memory structures that improves data retention, reduces leakage current, and improves operation speeds. The capacitor-less or capacitor-free multi-gate vertical 1T memory structures can include a vertical cylindrical body-shaped cylindrical body surrounded by multiple gates. In some aspects, the cylindrical body can be surrounded by a word line gate, a plate line gate, and a bottom selection gate. In some aspects, the cylindrical body can be surrounded by a word line gate, and multiple plate line gates. Bit lines can be formed above the cylindrical body. A memory cell is formed at the intersection between a word line and a bit line. The capacitor-less or capacitor-free multi-gate vertical 1T memory structures of the present disclosure can provide various benefits, including but not limited to, improved transistor carrier density, improved program/erase speeds, among other things.

FIG. 1 is a schematic perspective illustration of dual-gate SGT device 100, according to some exemplary aspects. Dual-gate SGT device 100 can be configured to provide two gates (e.g., word line 142 and plate line 146) surrounding a channel region (e.g., cylindrical body 110) on all sides. Dual-gate SGT device 100 can be further configured to operate as a volatile capacitor-free 3D memory device.

As shown in FIG. 1, dual-gate SGT device 100 can include cylindrical body 110, bit line (BL) 120, source line (SL) 130, and SGT cell 140. Cylindrical body 110 can be configured to store charge (e.g., holes). BL 120 can be configured to address cylindrical body 110 in dual-gate SGT device 100 and act as a drain connection to cylindrical body 110. SL 130 can be configured to address cylindrical body 110 in dual-gate SGT device 100 and act as a source connection to cylindrical body 110. SGT cell 140 can be configured to address cylindrical body 110 in dual-gate SGT device 100 and act as a gate connection to cylindrical body 110. In some aspects, different voltage combinations applied to BL 120, SL 130, and SGT cell 140 can define read, program (write), and erase operations in dual-gate SGT device 100.

SGT cell 140 can include word line (WL) 142 and plate line (PL) 146. WL 142 can be electrically connected to WL contact 144, and configured to address cylindrical body 110 in dual-gate SGT device 100 and act as a first gate connection to cylindrical body 110. In some aspects, WL 142 can act as a top select gate connection. In some aspects, WL 142 can provide a voltage to read, program, or erase charge on cylindrical body 110. PL 146 can be electrically connected to PL contact 148, and configured to address cylindrical body 110 in dual-gate SGT device 100 and act as a second gate connection of cylindrical body 110. In some aspects, PL 146 can act as a traditional current-valve gate (e.g., similar to a metal-oxide-semiconductor field-effect transistor (MOSFET) gate) for cylindrical body 110 and cover a majority of a length of cylindrical body 110. In some aspects, PL 146 can provide a voltage to read, program, or erase charge on cylindrical body 110. In some aspects, dual-gate SGT device 100 can form part of DFM device 200 shown in FIG. 2.

Figure 2:
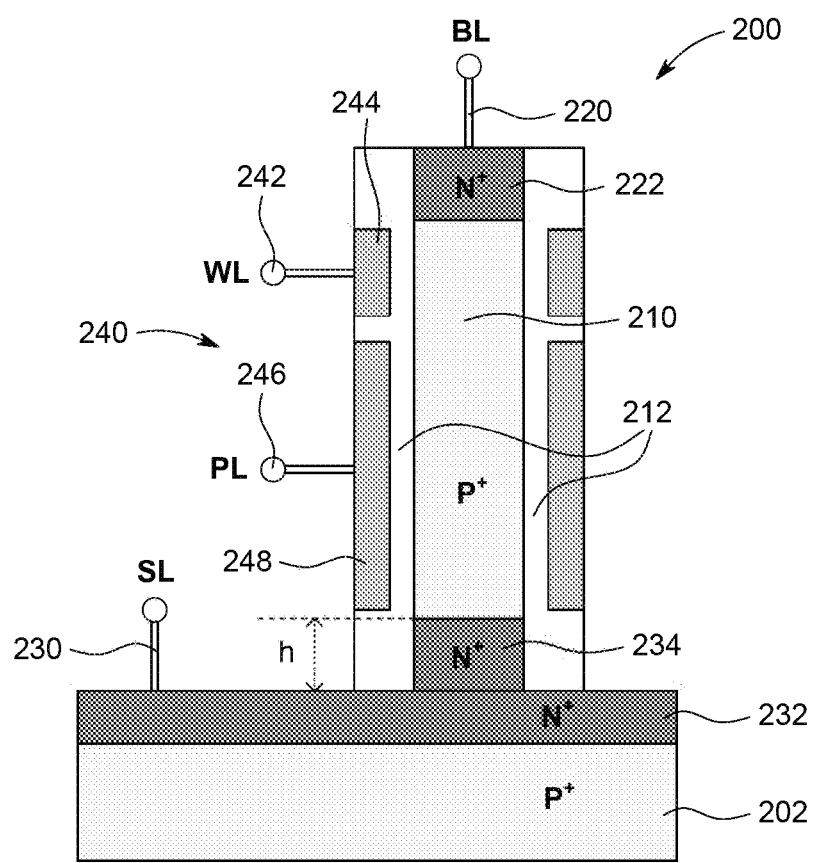
FIG. 2 is a schematic cross-sectional illustration of a DFM device, according to some exemplary aspects.

FIG. 2 illustrate DFM device 200, according to exemplary aspects. FIG. 2 is a schematic cross-sectional illustration of DFM device 200, according to some exemplary aspects. DFM device 200 can be configured to include dual-gate SGT device 100 in a vertical arrangement on substrate 202 and operate as a volatile capacitor-free 3D memory device. DFM device 200 can be further configured to provide faster operation speeds and higher density than DRAM or other types of volatile memory. DFM device 200 can be further configured to provide block refresh and block erase operations similar to flash memory functionality.

As shown in FIG. 2, DFM device 200 can include substrate 202, cylindrical body 210, Dielectric spacer 212, bit line (BL) 220, BL contact 222, source line (SL) 230, SL contact 232, source cap 234, and DFM cell 240.

Substrate 202 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials, and any combinations thereof. In some aspects, substrate 202 can be double-side polished prior to peripheral device fabrication. In this example, substrate 202 includes surfaces on the top and bottom sides both polished and treated to provide a smooth surface for high quality semiconductor devices. In some aspects, substrate 202 can be a dielectric layer formed of silicon, silicon oxide, silicon nitride, or any suitable dielectric material. Substrate 202 can be configured to support cylindrical body 210, Dielectric spacer 212, BL contact 222, SL contact 232, source cap 234, and DFM cell 240. Substrate 202 can be coupled to SL contact 232. In some aspects, substrate 202 can be a p-type semiconductor (e.g., p+), for example, doped silicon.

Cylindrical body 210 can be configured to store charge (e.g., holes). Cylindrical body 210 can extend in a vertical direction (e.g., z direction) with reference to a top surface of substrate 202. In some aspects, cylindrical body 210 can be formed of a pillar structure, such as a structure having a cylindrical body with a rectangular-shaped cross-sectional area. A diameter of the pillar structure of cylindrical body 210 can be in a range from about 2 nm to about 30 nm, and a height of the pillar structure of cylindrical body 210 can be in a range from about 40 nm to about 120 nm, such as about 100 nm. Cylindrical body 210 can be formed of a semiconductor material doped with suitable dopants. For example, cylindrical body 210 can be a silicon material doped with p-type dopants, such as boron, aluminum, nitrogen, gallium, indium, and/or combinations thereof. In some aspects, the dopant concentration of the p-type dopants can be between about $1\times10^{16}$ atom/cm$^3$ to about $1\times10^{22}$ atom/cm$^3$. In some aspects, cylindrical body 210 can be formed using an intrinsic semiconductor material, such as intrinsic polycrystalline silicon. As shown in FIG. 2, cylindrical body 210 can be formed between BL contact 222 and source cap 234.

Dielectric spacer 212 can surround cylindrical body 210 and be configured to provide electrical insulation between cylindrical body 210 and DFM cell 240 (e.g., word line contact 244 and plate line contact 248). In some aspects, Dielectric spacer 212 can be a high-k dielectric configured to increase a gate capacitance and decrease a leakage current in cylindrical body 210.

BL 220 can be configured to address cylindrical body 210 in DFM device 200 and be coupled to BL contact 222. In some aspects, BL 220 can be formed using a suitable conductive material, such as tungsten, cobalt, copper, aluminum, polysilicon, doped silicon, silicides, and/or combinations thereof. BL contact 222 can be configured to act as a drain connection to cylindrical body 210. In some aspects, BL contact 222 can be formed of a semiconductor material doped with suitable dopants, such as n-type dopants. such as phosphorus, arsenic, antimony, bismuth, lithium, and/or combinations thereof. In some aspects, the dopant concentration of the n-type dopants can be between about $1\times10^{16}$ atom/cm$^3$ to about $1\times10^{22}$ atom/cm$^3$. In some aspects, the dopant concentration of n-type dopants can be greater than about $1\times10^{20}$ atom/cm$^3$. In some aspects, BL contact 222 can be formed by doping a top portion of cylindrical body 210 with n-type dopants.

SL 230 can be configured to address cylindrical body 210 in DFM device 200 and be coupled to SL contact 232 and source cap 234. In some aspects, SL 230 can be formed using a suitable conductive material, such as tungsten, cobalt, copper, aluminum, polysilicon, doped silicon, silicides, and/or combinations thereof. SL contact 232 and source cap can be configured to act as a source connection to cylindrical body 210. In some aspects, SL contact 232 can be a conductive structure, such as a semiconductor layer doped with suitable dopants. In some aspects, SL contact 232 can be formed of a semiconductor material doped with n-type dopants, such as phosphorus, arsenic, antimony, bismuth, lithium, and/or combinations thereof. In some aspects, the dopant concentration of the n-type dopants can be between about $1\times10^{16}$ atom/cm$^3$ to about $1\times10^{22}$ atom/cm$^3$.

In some aspects, source cap 234 can include epitaxially-grown semiconductor material having a height h in the vertical direction. In some aspects, the height h is no less than about 5 nm. For example, the height h can be in a range from about 5 nm to about 30 nm. In some aspects, the epitaxially-grown semiconductor material is the same material as the material of SL contact 232. In some aspects, the epitaxially-grown semiconductor material includes a different material from the material of SL contact 232. The epitaxially-grown semiconductor material may include semiconductor material, such as germanium and silicon; compound semiconductor materials, such as gallium arsenide, and aluminum gallium arsenide; or a semiconductor alloy, such as silicon germanium and gallium arsenide phosphide. Further, source cap 234 can be in-situ doped during the epitaxial growth process or by an ion implantation process after the epitaxial growth process. In some aspects, source cap 234 can include epitaxially-grown semiconductor material doped with n-type dopants, such as phosphorus, arsenic, antimony, bismuth, lithium, and/or combinations thereof. In some aspects, the dopant concentration of the n-type dopants can be between about $1\times10^{16}$ atom/cm$^3$ to about $1\times10^{22}$ atom/cm$^3$.

DFM cell 240 can be configured to address cylindrical body 210 in DFM device 200 and act as a gate connection to cylindrical body 210. In some aspects, different voltage combinations applied to BL 220, SL 230, and DFM cell 240 can define read, program (write), and erase operations in DFM device 200.

DFM cell 240 can include word line (WL) 242, WL contact 244, plate line (PL) 246, and PL contact 248. WL 242 can be configured to address cylindrical body 210 in DFM device 200 and be coupled to WL contact 244. WL contact 244 can be configured to act as a first gate connection to cylindrical body 210. WL contact 244 can surround an upper portion of dielectric spacer 212 which surrounds an upper portion of the sidewall surfaces of cylindrical body 210 thereby forming a first concentric transistor. In some aspects, WL contact 244 can include a suitable conductive material, such as tungsten, cobalt, copper, aluminum, polysilicon, doped silicon, silicides, and/or combinations thereof. In some aspects, WL 242 can act as a top select gate connection. In some aspects, WL 242 can provide voltage to WL contact 244, thereby inducing an electric field within cylindrical body 210, to read, program, or erase charge on cylindrical body 210.

PL 246 can be configured to address cylindrical body 210 in DFM device 200 and be coupled to PL contact 248. PL contact 248 can be configured to act as a second gate connection to cylindrical body 210. PL contact 248 can surround a low portion of dielectric spacer 212 which surrounds a lower portion of the sidewall surfaces of cylindrical body 210 thereby forming a second concentric transistor. For example, the sidewall surface of PL 246 can be positioned around a circumference of cylindrical body 106. In some aspects, the sidewall surface of PL 246 can be concentric with the sidewall surface of cylindrical body 210. In some aspects, PL contact 248 can include a conductive material (e.g., metal, polysilicon, tungsten, etc.). In some aspects, PL 246 can act as a traditional current-valve gate (e.g., similar to a MOSFET gate) for cylindrical body 210 and cover a majority of a length of cylindrical body 210. In some aspects, PL 246 can provide voltage to PL contact 248, thereby inducing an electric field within cylindrical body 210, to read, program, or erase charge on cylindrical body 210.

It is noted that, when source cap 234 does not exist and SL contact 232 is in contact with cylindrical body 210 directly, a depletion region can be generated in the n+ source region (e.g., SL contact 232) when a positive voltage is applied to PL contact 248. In such a case, the parasitic resistance increases, and may cause formation of a hole inversion layer on the top surface of n+ source region (e.g., SL contact 232), which may act as a leakage channel between PL 246 and SL 230, resulting in a PL-SL tunneling/breakdown leakage current. In order to suppressed the formation of the parasitic leakage channel, the distance between 248 and the top surface of SL contact 232 can be increased. However, a parasitic resistance that is not easy to reverse is inserted between the PL channel (e.g., cylindrical body 120) and the source region (e.g., SL contact 232), which affects normal operation of DFM device 200. By adding source cap 234 with a height h to the n+ source region, the disclosed design can eliminate the parasitic leakage channel between PL 246 and SL 230, suppress the PL-SL tunneling/breakdown leakage current, and reduce the parasitic capacitance between PL 246 and SL 230 to increase the operating speed of DFM device 200.

In some aspects, multi-gate DFM devices can provide a capacitor-free dynamic random-access memory device to increase memory storage efficiency, increase read, program, and erase operation rates, decrease leakage current, decrease junction current, decrease power consumption, increase charge retention times, and/or decrease refresh rates.

Figure 3:
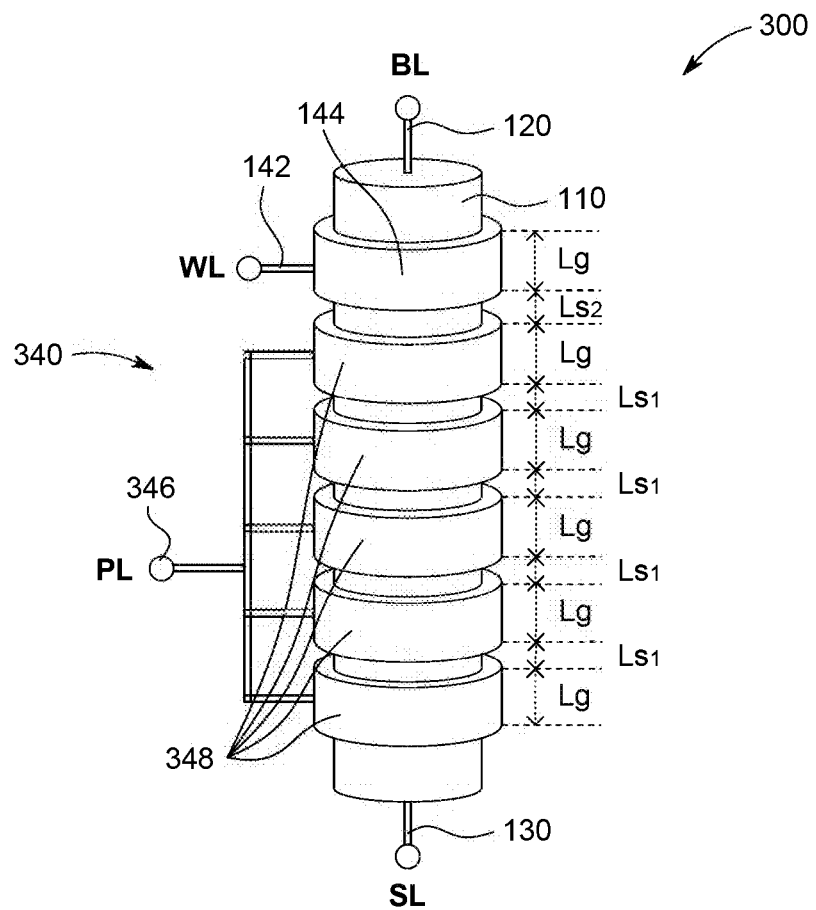
FIG. 3 is a schematic perspective illustration of a multi-gate SGT device, according to some exemplary aspects.

FIG. 3 is a schematic perspective illustration of multi-gate SGT device 300, according to some exemplary aspects. Multi-gate SGT device 300 can be configured to provide a plurality of gates (e.g., WL contact 144 and multiple PL contacts 348) surrounding a channel region (e.g., cylindrical body 110) on all sides. Multi-gate SGT device 300 can be further configured to operate as a volatile capacitor-free 3D memory device.

As shown in FIG. 3, multi-gate SGT device 300 can include cylindrical body 110, bit line (BL) 120, source line (SL) 130, and SGT cell 340. It is noted that, elements or components corresponding to those in FIG. 1 are designated by similar numeral references. Different from dual-gate SGT device 100 shown in FIG. 1, the PL contact of multi-gate SGT device 300 can include a plurality of PL contact segments 348. In some aspects, each PL contact segments 348 can have a same height Lg in the vertical direction, as the height Lg of the WL contact 144 in the vertical direction. The distance Ls1 between adjacent PL contact segments 348 can be the same or different from the distance Ls2 between WL contact 144 and its adjacent PL contact segment 348. In some aspects, the distance Ls2 can be determined based on design requirement of actual impact ionization efficiency. In some aspects, height Lg can be in a range between about 5 nm and about 100 nm, distance Ls1 can be in a range between about 5 nm and about 100 nm, and distance Ls1 can be in a range between about 5 nm and about 100 nm. The effective length of PL contact can be defined by the number of PL contact segments 348. It is noted that, although there are five PL contact segments 348 shown in FIG. 3, there can be any suitable number (e.g., 2, 3, 4, 6, 7, 8, 9, etc.) of PL contact segments 348.

In some aspects, the plurality of PL contact segments 348 can be parallel connected to PL 346 and share a common voltage configuration. PL 346 can be configured to address cylindrical body 110 in multi-gate SGT device 300. In some aspects, PL 346 can provide a voltage to read, program, or erase charge on cylindrical body 110 through the plurality of PL contact segments 348. In some aspects, multi-gate SGT device 300 can form part of DFM device 400 shown in FIG. 4.

Figure 4:
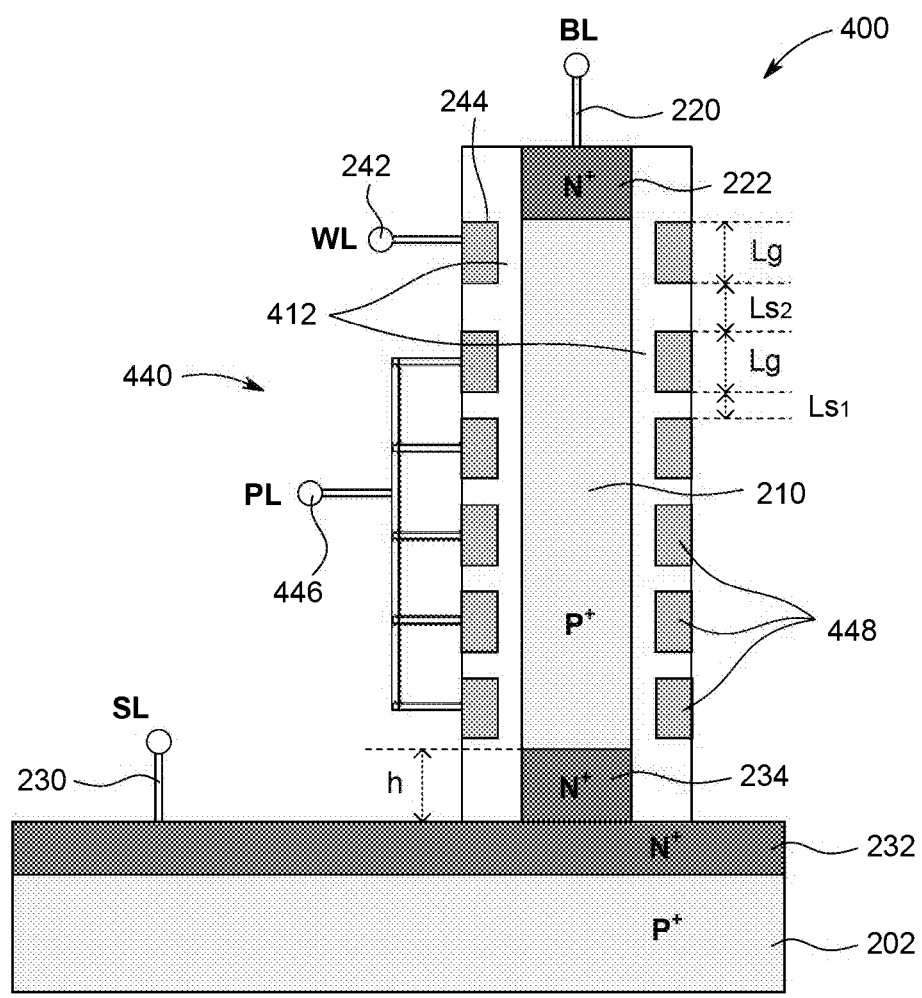
FIG. 4 is a schematic cross-sectional illustration of a multi-gate DFM device, according to some exemplary aspects.

FIG. 4 is schematic cross-sectional illustration of multi-gate DFM device 400, according to some exemplary aspects. Multi-gate DFM device 400 can be configured to operate as a volatile capacitor-free dynamic random-access 3D memory device. Multi-gate DFM device 400 can be further configured to increase memory storage efficiency. Multi-gate DFM device 400 can be further configured to increase read, program, and erase operation rates. Multi-gate DFM device 400 can be further configured to decrease leakage current, decrease junction current, and decrease power consumption. Multi-gate DFM device 400 can be further configured to provide faster operation speeds and higher density than DRAM or other types of volatile memory. Multi-gate DFM device 400 can be further configured to provide block refresh and block erase operations similar to flash memory functionality.

As shown in FIG. 4, multi-gate DFM device 400 can include substrate 202, cylindrical body 210, dielectric spacer 412, bit line (BL) 220, BL contact 222, source line (SL) 230, SL contact 232, source cap 234, and DFM cell 440. It is noted that, elements or components corresponding to those in FIG. 2 are designated by similar numeral references. In some aspects, multi-gate DFM device 400 can be a vertical 3D memory device. In some aspects, multi-gate DFM device 400 can include one or more DFM devices (e.g., DFM device 400 shown in FIG. 4).

Different from the dual-gate DFM device 200 shown in FIG. 2, multi-gate DFM device 400 as shown in FIG. 4 includes a plurality of PL contact segments 448. In some aspects, each PL contact segments 448 and WL contact 244 can have a same height Lg in the vertical direction. Adjacent PL contact segments 448 can have a same distance Ls1 from each other. The distance Ls1 can be the same or different from the distance Ls2 between WL contact 244 and its adjacent PL contact segment 448. In some aspects, the distance Ls2 can be determined based on design requirement of actual impact ionization efficiency. It is noted that, although there are five PL contact segments 448 shown in FIG. 4, there can be any suitable number of PL contact segments 448.

In some aspects, the plurality of PL contact segments 448 can be parallel connected to PL 446 and share a common voltage configuration. PL 446 can be configured to address cylindrical body 210 in multi-gate SGT device 400. The plurality of PL contact segments 448 can be further configured to program (e.g., write) cylindrical body 210. In some aspects, the plurality of PL contact segments 448 can control electrical charge conduction in cylindrical body 210. For example, the plurality of PL contact segments 448 can control electrical charge conduction between WL 242 and PL 446.

The plurality of PL contact segments 448 can be configured to act as multiple gate connections to cylindrical body 210. Each of the plurality of PL contact segments 448 can surround a corresponding portion of dielectric spacer 412 which surrounds a corresponding portion of cylindrical body 210 thereby forming a concentric transistor in DFM cell 440. In some aspects, the plurality of PL contact segments 448 can include a conductive material (e.g., metal, polysilicon, tungsten, etc.). In some aspects, different voltage combinations applied to BL 220, SL 230, WL 242, and PL 446 can define read, program (write), and erase operations in multi-gate DFM device 400.

In some aspects, the plurality of PL contact segments 448 can be configured to increase a program (write) rate of cylindrical body 2210. For example, for impact ionization programming, the plurality of PL contact segments 448 can increase a charge flow from WL 242 to PL 446 thereby increasing the program (write) rate. In some aspects, the plurality of PL contact segments 448 can increase a charge flow in cylindrical body 210. In some aspects, the plurality of PL contact segments 448 can decrease a program (write) time in multi-gate DFM device 400. In some aspects, the plurality of PL contact segments 448 can increase a program (write) rate in multi-gate DFM device 400. In some aspects, the plurality of PL contact segments 448 can decrease a read time in multi-gate DFM device 400. In some aspects, the plurality of PL contact segments 448 can increase a read rate in multi-gate DFM device 400. In some aspects, the plurality of PL contact segments 448 can decrease an erase time in multi-gate DFM device 400. In some aspects, the plurality of PL contact segments 448 can increase an erase rate in multi-gate DFM device 400.

Figure 5:
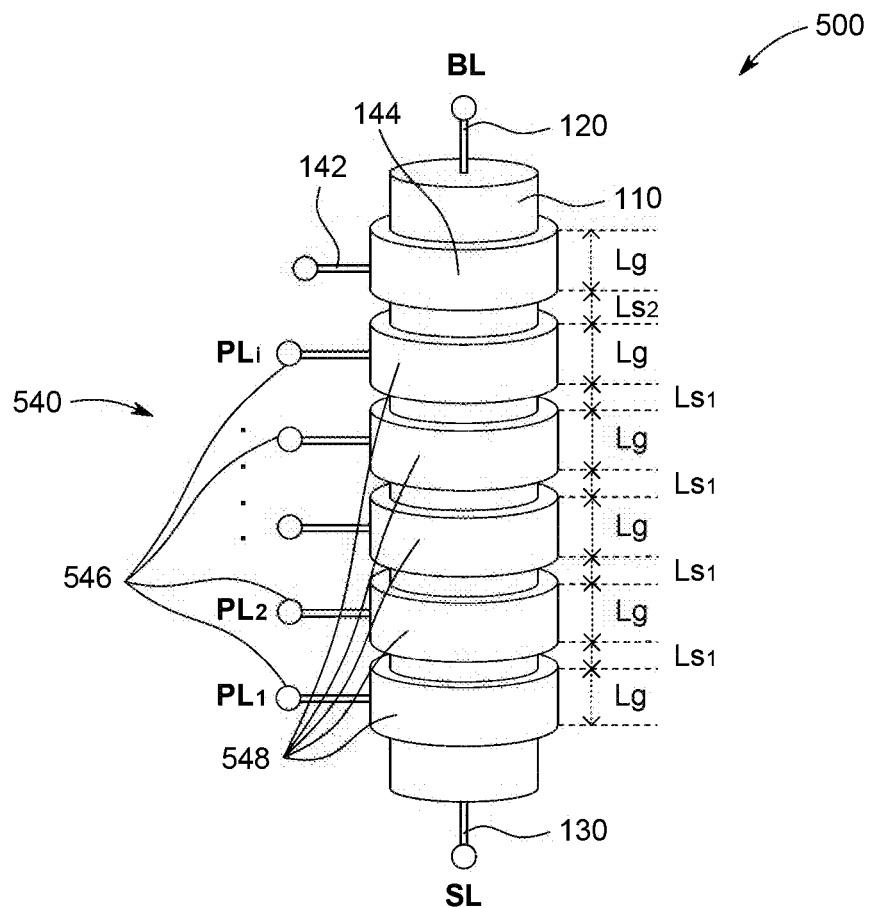
FIG. 5 is a schematic perspective illustration of another multi-gate SGT device, according to some other exemplary aspects.

FIG. 5 is a schematic perspective illustration of multi-gate SGT device 500, according to some other exemplary aspects. Multi-gate SGT device 500 can be configured to provide a plurality of gates (e.g., WL contact 144 and multiple PL contacts 546) surrounding a channel region (e.g., cylindrical body 110) on all sides. Multi-gate SGT device 500 can be further configured to operate as a volatile capacitor-free 3D memory device.

As shown in FIG. 5, multi-gate SGT device 500 can include cylindrical body 110, bit line (BL) 120, source line (SL) 130, and SGT cell 540. It is noted that, elements or components corresponding to those in FIGS. 1 and 3 are designated by similar numeral references. Similar to multi-gate SGT device 300 shown in FIG. 3, multi-gate SGT device 500 can include a plurality of PL contact segments 548. In some aspects, each PL contact segments 548 can have a same height Lg in the vertical direction, as the height Lg of the WL contact 144 in the vertical direction. The distance Ls1 between adjacent PL contact segments 548 can be the same or different from the distance Ls2 between WL contact 144 and its adjacent PL contact segment 548. In some aspects, the distance Ls2 can be determined based on design requirement of actual impact ionization efficiency. The effective length of PL contact can be defined by the number of PL contact segments 548. It is noted that, although there are five PL contact segments 548 shown in FIG. 5, there can be any suitable number of PL contact segments 548.

Different from multi-gate SGT device 300 shown in FIG. 3, the plurality of PL contact segments 548 of multi-gate SGT device 500 as shown in FIG. 5 can be respectively connected to a number i of independent power supplies (e.g., PLs 546 including $PL_1$, $PL_2$, . . . , $PL_i$) to regulate the channel surface potential distribution of cylindrical body 110 to maximize the drift speed of electrons reaching the bottom space charge region of WL contact 144 and enhance the impact ionization rate. In some aspects, each of the multiple PLs 546 can provide an independent voltage to address cylindrical body 110 through a corresponding PL contact segment 548. In some aspects, multi-gate SGT device 500 can form part of DFM device 600 shown in FIG. 6.

Figure 6:
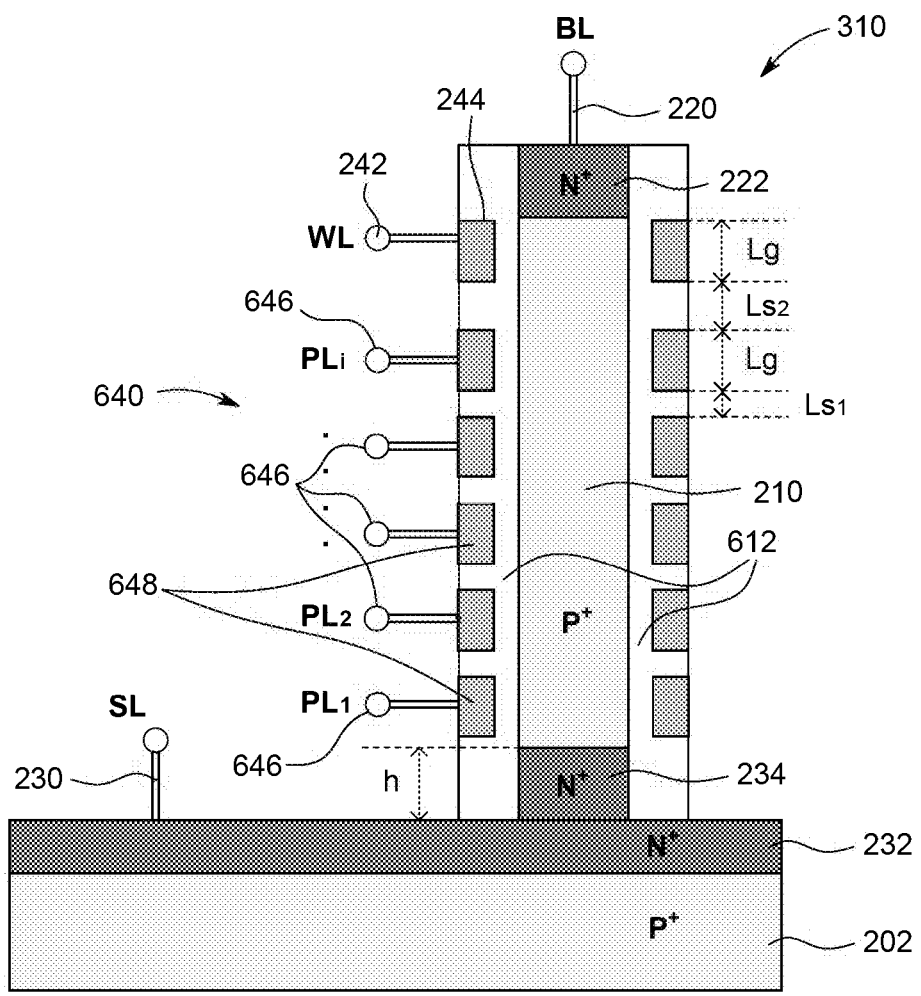
FIG. 6 is a schematic cross-sectional illustration of another multi-gate DFM device, according to some other exemplary aspects.

FIG. 6 is schematic cross-sectional illustration of multi-gate DFM device 600, according to some other exemplary aspects. Multi-gate DFM device 600 can be configured to operate as a volatile capacitor-free dynamic random-access 3D memory device. Multi-gate DFM device 600 can be further configured to increase memory storage efficiency. Multi-gate DFM device 600 can be further configured to increase read, program, and erase operation rates. Multi-gate DFM device 600 can be further configured to decrease leakage current, decrease junction current, and decrease power consumption. Multi-gate DFM device 600 can be further configured to provide faster operation speeds and higher density than DRAM or other types of volatile memory. Multi-gate DFM device 600 can be further configured to provide block refresh and block erase operations similar to flash memory functionality.

As shown in FIG. 6, multi-gate DFM device 600 can include substrate 202, cylindrical body 210, dielectric spacer 612, bit line (BL) 220, BL contact 222, source line (SL) 230, SL contact 232, source cap 234, and DFM cell 640. It is noted that, elements or components corresponding to those in FIGS. 2 and 4 are designated by similar numeral references. In some aspects, multi-gate DFM device 600 can be a vertical 3D memory device. In some aspects, multi-gate DFM device 600 can include one or more DFM devices (e.g., DFM device 600 shown in FIG. 6).

Multi-gate DFM device 600 includes a plurality of PL contact segments 648. In some aspects, each PL contact segments 648 and WL contact 244 can have a same height Lg in the vertical direction. Adjacent PL contact segments 648 can have a same distance Ls1 from each other. The distance Ls1 can be the same or different from the distance Ls2 between WL contact 244 and its adjacent PL contact segment 648. In some aspects, the distance Ls2 can be determined based on design requirement of actual impact ionization efficiency. It is noted that, although there are five PL contact segments 648 shown in FIG. 6, there can be any suitable number of PL contact segments 648.

Different from the multi-gate DFM device 400 shown in FIG. 4, each of the plurality of PL contact segments 648 of multi-gate DFM device 600 can be independently connected to a corresponding PL 646, such as $PL_1$, $PL_2$, . . . , $PL_i$, which can be applied to independent voltages respectively. The plurality of PLs 646 can be configured to address cylindrical body 210 in multi-gate SGT device 600. The plurality of PL contact segments 648 can be further configured to program (e.g., write) cylindrical body 210. In some aspects, the plurality of PL contact segments 648 can control electrical charge conduction in cylindrical body 210. For example, the plurality of PL contact segments 648 can control electrical charge conduction between WL 242 and PLs 646.

The plurality of PL contact segments 648 can be configured to act as multiple gate connections to cylindrical body 210. Each of the plurality of PL contact segments 648 can surround a corresponding portion of dielectric spacer 612 which surrounds a corresponding portion of cylindrical body 210 thereby forming a concentric transistor in DFM cell 640. In some aspects, the plurality of PL contact segments 648 can include a conductive material (e.g., metal, polysilicon, tungsten, etc.). In some aspects, different voltage combinations applied to BL 220, SL 230, WL 242, and PLs 646 can define read, program (write), and erase operations in multi-gate DFM device 600.

In some aspects, the plurality of PL contact segments 648 can be configured to increase a program (write) rate of cylindrical body 210. For example, for impact ionization programming, the plurality of PL contact segments 648 can increase a charge flow from WL 242 to PLs 646 thereby increasing the program (write) rate. In some aspects, the plurality of PL contact segments 648 can increase a charge flow in cylindrical body 210. In some aspects, the plurality of PL contact segments 648 can decrease a program (write) time in multi-gate DFM device 600. In some aspects, the plurality of PL contact segments 648 can increase a program (write) rate in multi-gate DFM device 600. In some aspects, the plurality of PL contact segments 648 can decrease a read time in multi-gate DFM device 600. In some aspects, the plurality of PL contact segments 648 can increase a read rate in multi-gate DFM device 600. In some aspects, the plurality of PL contact segments 648 can decrease an erase time in multi-gate DFM device 600. In some aspects, the plurality of PL contact segments 648 can increase an erase rate in multi-gate DFM device 600.

Figure 7:
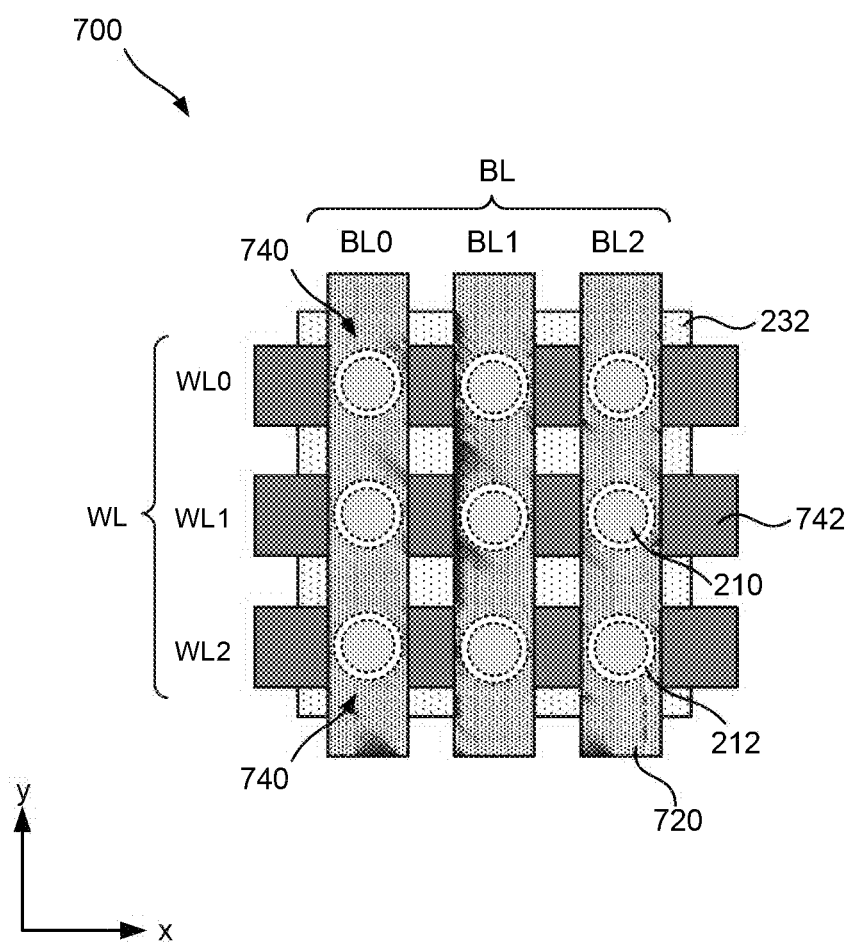
FIG. 7 is a schematic top-down illustration of a memory array, according to some exemplary aspects.

FIG. 7 illustrates a top-down view of a memory array 700 formed of capacitor-less dual-gate or multi-gate vertical 1T memory cells, according to some aspects of the present disclosure. Examples of the 1T memory cells can be any of the memory cells 140, 240, 340, 440, 540, 640 described above in connection with FIGS. 1-6. Elements corresponding to those in FIGS. 1-6 are designated by similar numeral references. Memory array 700 can include additional memory cells that are not illustrated for simplicity.

Multiple bit lines and word lines are intersected to form memory array 700. As shown in FIG. 7, multiple word lines 742 can extend in a first lateral direction (e.g., x direction) and designated as WL0, WL1, and WL2, etc. Similarly, multiple bit lines 720 can extend in a second lateral direction (e.g., y direction) and designated as BL0, BL1, and BL2, etc. Each memory cell 740 is formed at an intersection of a word line 742 and a bit line 720. For example, memory cells 740 can be formed at the intersection of WL0 and BL0 and also at the intersection of WL2 and BL0.

Figure 8:
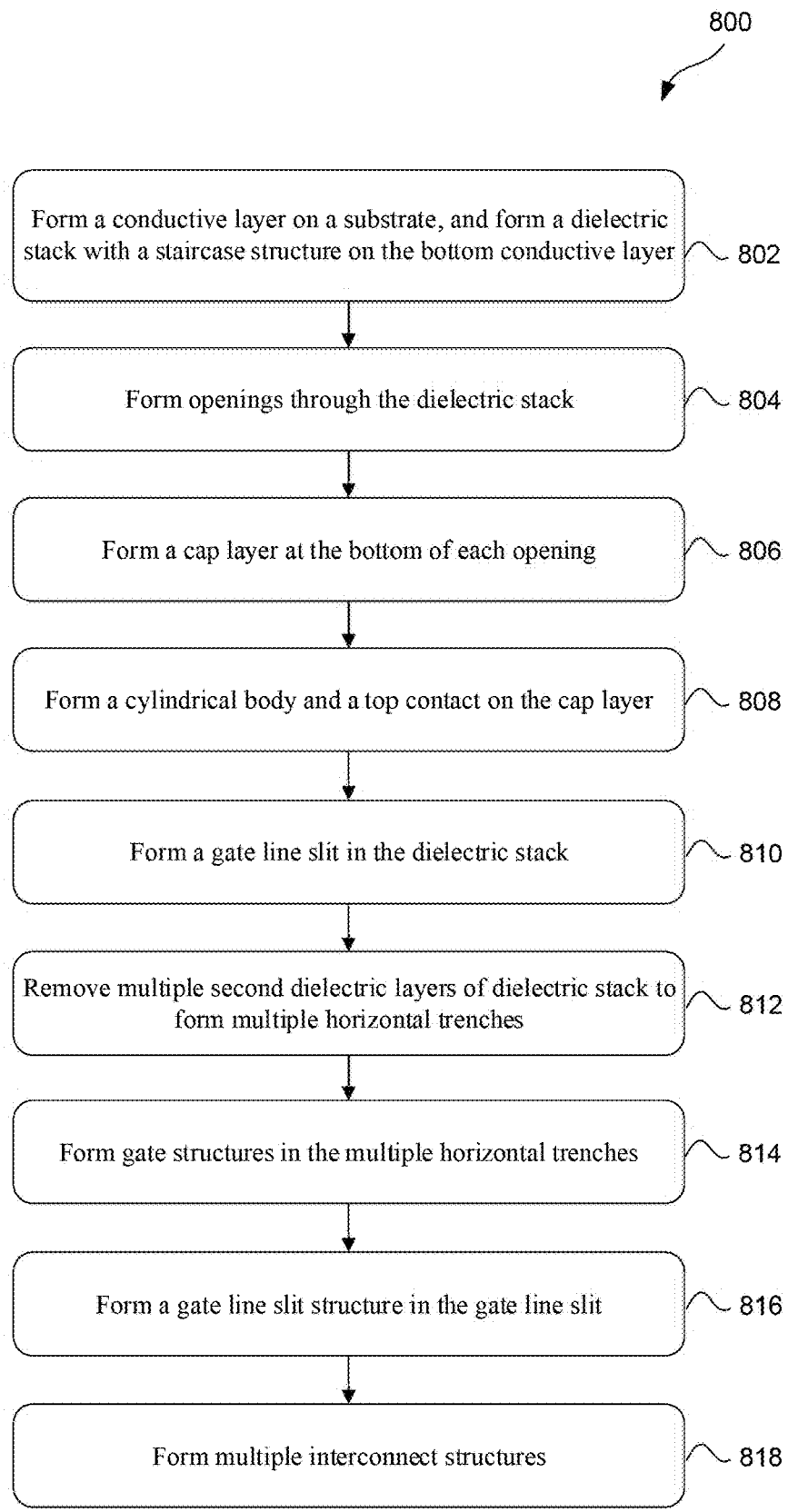
FIG. 8 is a flow diagram for a manufacturing process forming a 3D memory structure, according to some exemplary aspects.

FIG. 8 illustrates a method for forming a 3D memory structure in accordance with some aspects of the present disclosure. The operations of method 800 can be performed in a different order and/or vary, and method 800 can include more operations that are not described for simplicity. That is, not all operations in FIG. 8 are needed to perform the disclosure provided herein. Further, some of the operations may be performed simultaneously, sequentially, and/or in a different order than shown in FIG. 8. FIGS. 9A-9I are cross-sectional views of fabricating an exemplary 3D memory structure. FIGS. 9A-9I are provided as exemplary cross-sectional views to facilitate in the explanation of method 800. The fabrication processes provided here are exemplary, and alternative processes in accordance with this disclosure may be performed that are not shown in these figures. Additional layers and/or structures can be formed in 3D memory structure and are not illustrated in FIGS. 9A-9I for simplicity.

Figure 9A:
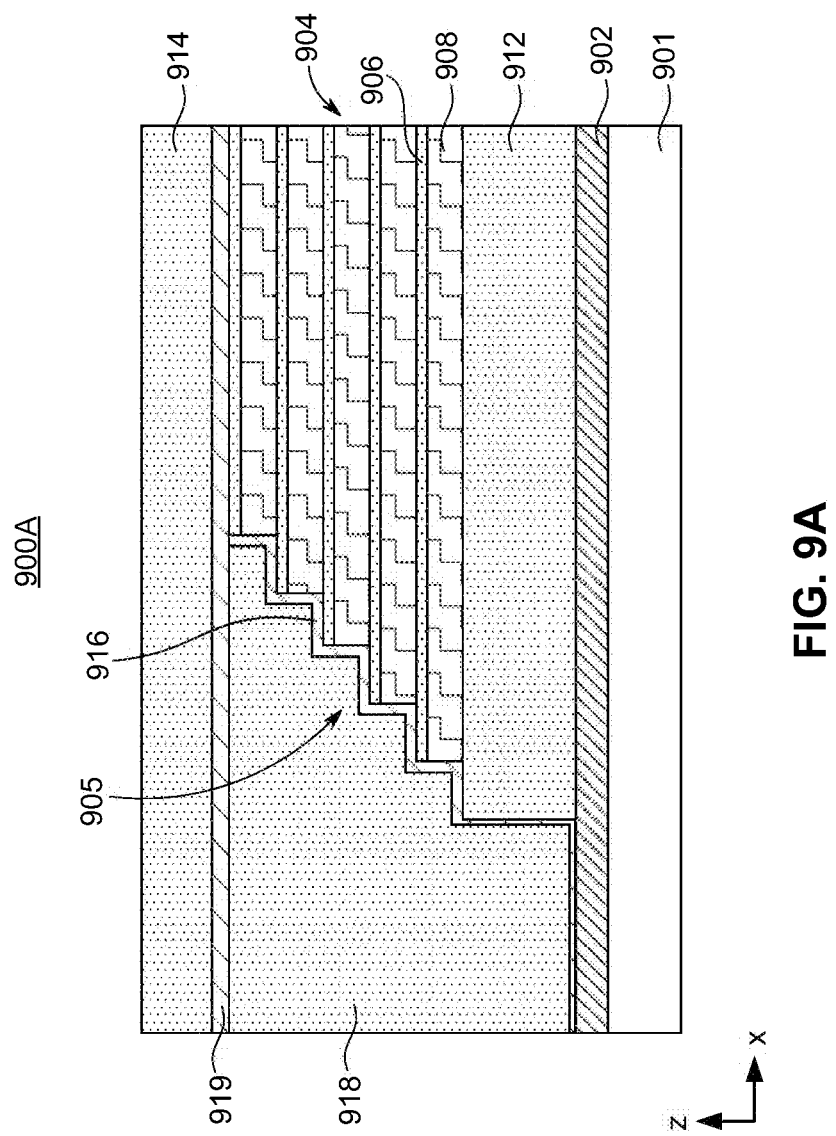
FIGS. 9A-9I are cross-sectional views of a 3D memory structure at certain stages of the manufacturing process of FIG. 8, according to some exemplary aspects, with FIGS. 9E-9I having first (I) and second (II) directional views.

Method 800 can begin at operation 802, in which a bottom conductive layer can be formed on a substrate, and a dielectric stack with a staircase structure can be formed on the bottom conductive layer, according to some aspects of the present disclosure. As shown in the example of FIG. 9A, dielectric stack 904 with staircase structure 905 including first dielectric layers 906 (e.g., silicon oxide) and second dielectric layers 908 (e.g., silicon nitride) can be formed as an dielectric stack atop bottom conductive layer 902, which is formed atop substrate 901.

Substrate 901 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some aspects, substrate 901 can include a dielectric layer (not shown), such as silicon oxide, silicon nitride, silicon oxynitride, and the like. In some aspects, substrate 901 can be a semiconductor layer doped with suitable dopants. For example, substrate 901 can be doped with p-type dopants (e.g., boron, indium, aluminum, gallium, etc., and/or combinations thereof).

Bottom conductive layer 902 can be formed on substrate 901. Bottom conductive layer 902 can extend in a lateral direction that is parallel to a top surface of substrate 901. In some aspects, bottom conductive layer 902 can be a conductive structure, such as a metal line or a semiconductor layer doped with suitable dopants. For example, bottom conductive layer 902 can be formed of tungsten, cobalt, copper, aluminum, any suitable metal, and/or combinations thereof. Bottom conductive layer 902 can be disposed using thin-film deposition processes including, but not limited to, chemical vapor deposition (CVD), plasma-enhanced CVD (PECVD), physical vapor deposition (PVD), atomic layer deposition (ALD), plasma-enhanced ALD (PEALD), and/or any combinations thereof. As another example, bottom conductive layer 902 can be formed of the same semiconductor material of substrate 901 but doped with opposite type of dopants. When substrate 901 is doped with p-type dopants, bottom conductive layer 902 can be doped with n-type of dopants (e.g., phosphorus, arsenic, antimony, bismuth, lithium, etc., and/or combinations thereof).

A dielectric stack 904 including a plurality of first dielectric layers 906 and second dielectric layers 908 can be formed on bottom conductive layer 902. The plurality of first dielectric layers 906 and second dielectric layers 908 are extended in the lateral direction, and alternate along a vertical direction that is perpendicular to the top surface of substrate 901. In some aspects, first dielectric layers 906 can be silicon oxide layers, and second dielectric layers 908 can be silicon nitride layers. Dielectric stack 904 can be formed by multiple thin film deposition processes including, but not limited to, Chemical Vapor Deposition (CVD), Physical Vapor Deposition (PVD), Atomic Layer Deposition (ALD), high-density-plasma CVD (HDP-CVD), sputtering, spin-coating, and/or any combinations thereof.

It is noted that, second dielectric layers 908 are used as sacrificial layers and will be replaced by conductive layers in subsequent processes. The later formed conductive layers can form WL contact and PL contact segments. For example, the top second dielectric layer 908 can be used to form the WL contact in subsequent processes, and the rest second dielectric layers 908 below the top second dielectric layer 908 can be used to form a plurality of PL contact segments. In some aspects, the plurality of second dielectric layers 908 can have a same thickness Tg between about 5 nm and about 200 nm, such as about 10 nm, about 15 nm, or about 20 nm. In some aspects, the plurality of first dielectric layers 906 can have a same thickness or different thicknesses. For example, the top first dielectric layer 906 beneath and adjacent to the top second dielectric layer 908 can have a second thickness Ts2 that is different from a first thickness Ts1 of the rest first dielectric layer 906 below the top first dielectric layer 906. In some aspects, first thickness Ts1 can be in a range between about 5 nm and about 200 nm, and second thickness Ts2 can be in a range between about 5 nm and about 200 nm. In some aspects, dielectric stack 904 can further include bottom isolation layer 912 (e.g., a silicon oxide layer) having a thickness H greater than Tg, Ts1 and Ts2.

A staircase structure 905 can be formed on one edge of dielectric stack 904. In some aspects, portions of dielectric stack 904 can be removed to form a staircase structure 905. In some aspects, multiple etch-trim processes can be performed repeatedly to form a set of steps of staircase structure 905. In some aspects, each step can include at least one first dielectric layer 906 and at least one second dielectric layer 908.

In some aspects, the etch-trim processes can include a set of repeating etch-trim processes to form the staircase structure 905 including a set of steps at the edge of dielectric stack 904. Specifically, for forming each step, a photoresist layer (not shown) can be used as a mask to expose a portion of the top surface of dielectric stack 904. For forming the first step, a width of the exposed top surface of dielectric stack 904 can be a step width. In some aspects, an anisotropic etching process, such as a reactive ion etching (RIE) process, or other suitable dry/wet etching process, can be performed to remove the exposed layer (e.g., second dielectric layer 908) that is exposed through the mask (i.e., the photoresist layer). The etching process can stop on the next lower layer (e.g., the first dielectric layer 906). The pattern in the mask (i.e., the photoresist layer) is then transferred to the layer (e.g., second dielectric layer 908) that has been etched. The exposed next lower layers (e.g., first dielectric layers 906) can be then removed by another etching process that stops on the next lower layers (e.g., second dielectric layer 908). As such, the first step can be created on the first two top layers of dielectric stack 904.

Next, the mask (i.e., the photoresist layer) can be reduced in size by removing a portion of the mask (also known as "trimming") above dielectric stack 904, such as by an isotropic etching process, to expose another step width of dielectric stack 904. The method can proceed by subjecting the structure to two anisotropic etching processes, including removing exposed portions of the two exposed layers (e.g., two second dielectric layers 908), and subsequently removing exposed portions of the two exposed next lower layers (e.g., first dielectric layers 906). As such, the first step can be lowered to the third and fourth top layers of dielectric stack 904, and a second step can be formed on the first two top layers of dielectric stack 904.

In some aspects, the successive reduction in size of the mask (i.e., the photoresist layer) and the two-step etching processes (also referred as etch-trim processes) can be repeated such that the staircase structure 905 including a set of steps can be formed on one edge of dielectric stack 904, as shown in FIG. 9A. The photoresist layer can be then removed. In some aspects, the removal process can include any suitable etching processes and cleaning processes. In some aspects, a staircase insulating layer 916 and a filing structure 918 can be formed to cover the exposed surfaces of staircase structure 905, an etch stop layer 919 and an top isolation layer 914 can be formed on filling structure 918 and dielectric stack 904.

Figure 9B:
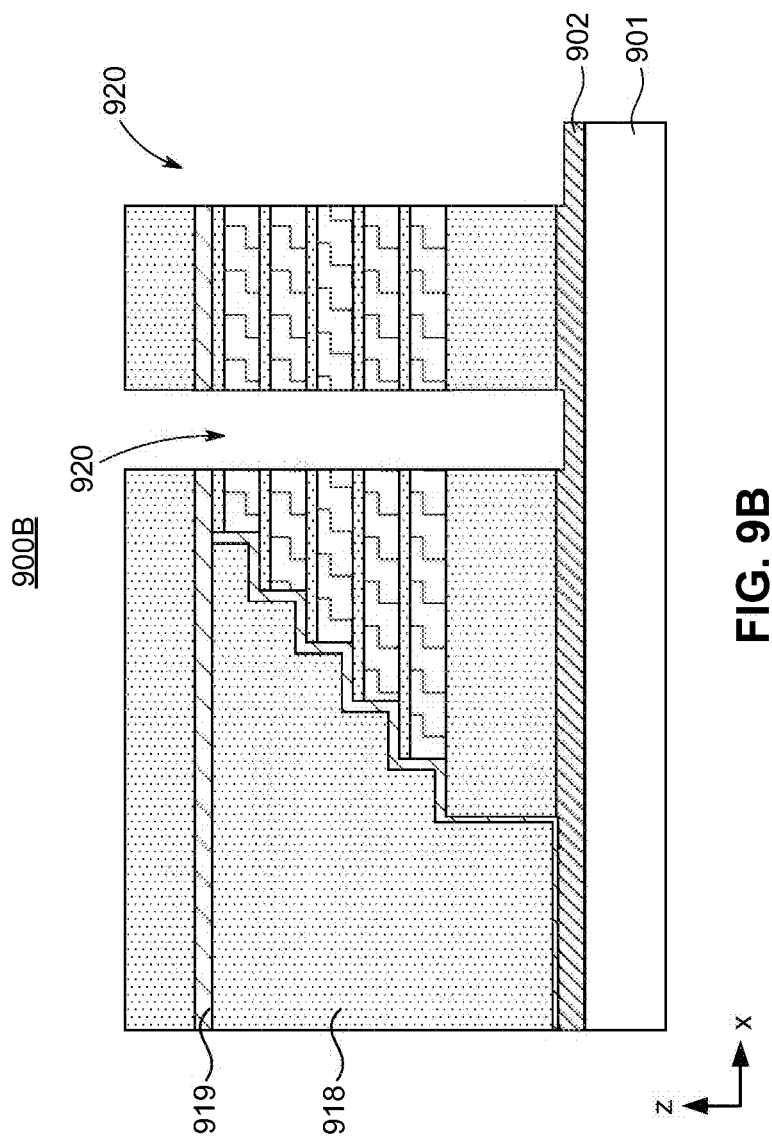

Method 800 can proceed to operation 804, in which openings can be formed through the dielectric stack, according to some aspects of the present disclosure. Referring to FIG. 9B, openings 920 can be formed by etching portions of top isolation layer 914, etch stop layer 919, and dielectric stack 904 until bottom conductive layer 902 is exposed.

In some aspects, openings 920 can be a cylindrical hole having a substantially rectangular cross-sectional area. A photolithography process can be used to expose portions of the top surface of top isolation layer 914 to be etched. Anisotropic etching, such as dry plasma etching processes or wet chemical etching processes, can be used to sequentially remove portions of top isolation layer 914, etch stop layer 919, and dielectric stack 904 until bottom conductive layer 902 is exposed. The etching processes can include multiple etching processes, each configured to remove the type of material that is exposed. Specifically, the etchants used in each etching process can be selected based on the material composition of top isolation layer 914, etch stop layer 919, first dielectric layers 906, second dielectric layers 908, and bottom isolation layer 912. For example, the etching processes can include suitable etchants for removing Sift and/or SiN. The etching processes can continue until a top surface of bottom conductive layer 902 is exposed. In some aspects, openings 920 extend into bottom conductive layer 902 to ensure that bottom conductive layer 902 is exposed within openings 920. Masking layers such as photoresists can be removed after openings 920 are formed.

Figure 9C:
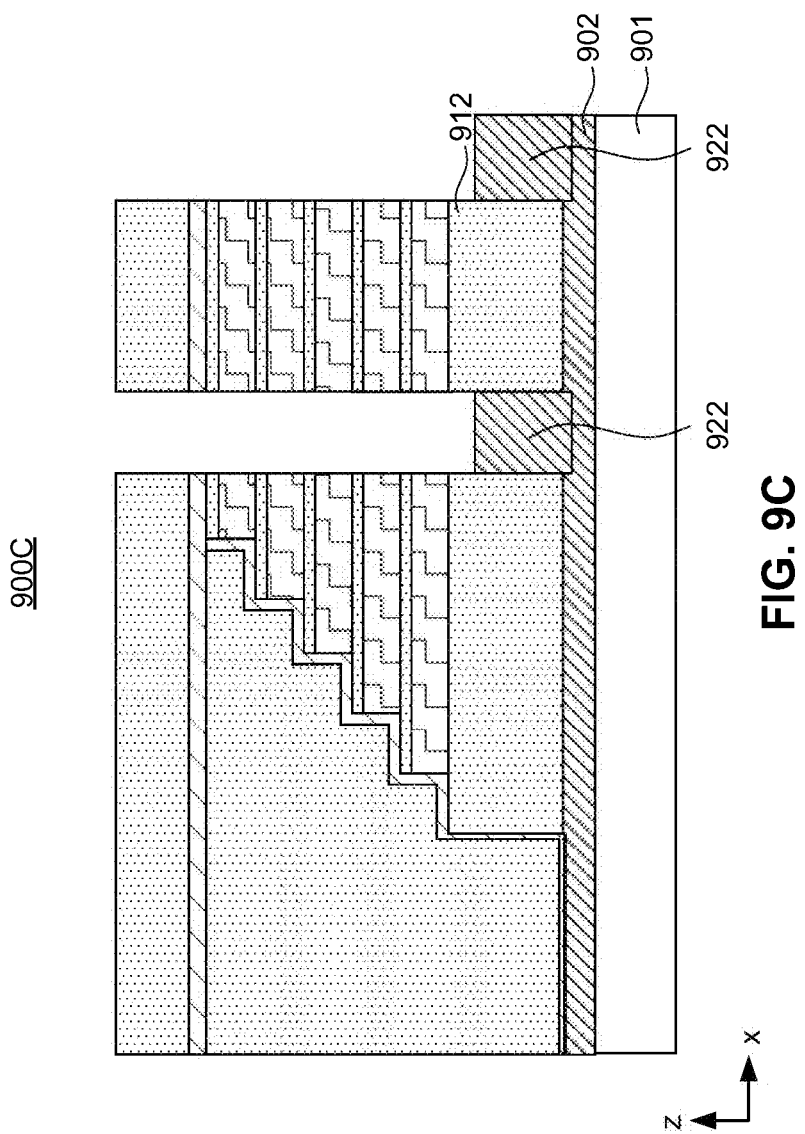

Method 800 can proceed to operation 806, in which a cap layer can be formed at the bottom of each opening, according to some aspects of the present disclosure. As shown in FIG. 9C, cap layer 922 can be formed at the bottom of each opening 920, and can be doped with same dopants with bottom conductive layer 902. For example, cap layer 922 can be doped with n-type dopants (e.g., phosphorus, arsenic, antimony, bismuth, lithium, etc., and/or combinations thereof). Cap layer 922 can be used as source cap (e.g., source cap 234 as shown in FIG. 2). Thus, a top surface of cap layer 922 is lower than a top surface of bottom isolation layer 912. In some aspects, a drop height D from the top surface of bottom isolation layer 912 to the top surface of cap layer 922 can be greater than 5 nm.

In some aspects, cap layer 922 are grown by CVD, e.g., low pressure chemical vapor deposition (LPCVD), atomic layer chemical vapor deposition (ALCVD), ultra-high vacuum chemical vapor deposition (UHVCVD), remote plasma chemical vapor deposition (RPCVD); molecular beam epitaxy (MBE) processes; any suitable epitaxial process; or any combinations thereof. In some aspects, cap layer 922 are grown by an epitaxial deposition/partial etch process, which repeats the epitaxial deposition/partial etch process at least once. Such repeated deposition/partial etch process is also called a cyclic deposition-etch (CDE) process. In some aspects, cap layer 922 are grown by selective epitaxial growth (SEG), where an etching gas is added to promote the selective growth of semiconductor material on the exposed surfaces of substrate 901, but not on insulating material (e.g., dielectric material of bottom isolation layer 912). Further, cap layer 922 may be in-situ doped during the epitaxial growth process or by an ion implantation process after the epitaxial growth process. In some aspects, cap layer 922 may be doped with n-type dopants, such as phosphorus, arsenic, antimony, bismuth, lithium, etc., and/or combinations thereof.

Figure 9D:
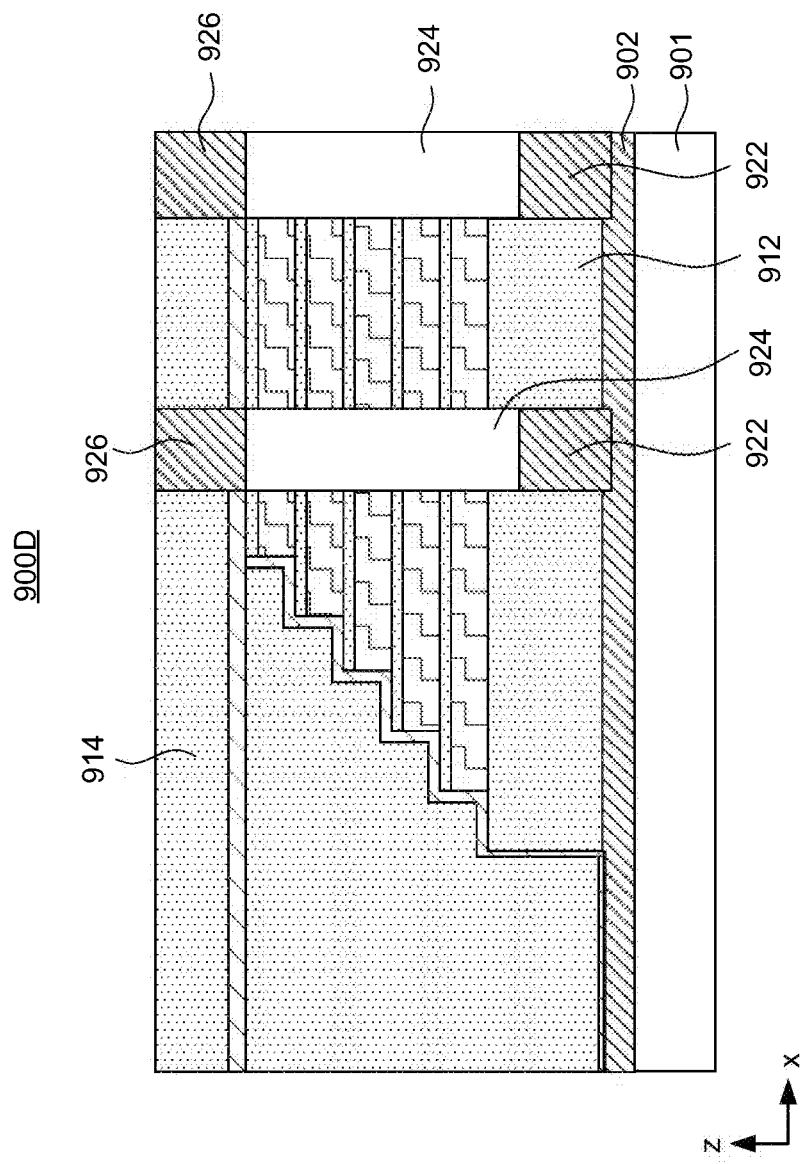

Method 800 can proceed to operation 808, in which a cylindrical body and a top contact can be formed in each opening and on the cap layer, according to some aspects of the present disclosure. As shown in FIG. 9D, a cylindrical body 924 can be formed atop cap layer 922 in each opening 920, and a top contact 926 can be formed atop on cylindrical body 924 in each opening 920.

In some aspects, forming floating bodies 924 and top contacts 926 can include filling openings 920 with a semiconductor material. For example, a semiconductor material can be filled into the openings 920 by epitaxial growth (e.g., SEG) or any suitable deposition method (e.g., CVD, PVD, ALD, etc.) and/or a recrystallization process. For example, a polysilicon structure can be epitaxially grown from cap layer 922. As another example, an amorphous silicon structure can be deposited on cap layer 922, and a heating process can transform the amorphous silicon structure to a polysilicon structure. In some aspects, the semiconductor material can extend through the entirety of openings 920 and a planarization process is performed such that top surfaces of the semiconductor material are coplanar with the top surface of top isolation layer 914. In some aspects, the semiconductor material can be formed using a silicon material, such as polysilicon material or single crystalline silicon material.

Floating bodies 924 and top contacts 926 can be formed based on the semiconductor material. In some aspects, the semiconductor material can be an intrinsic material or doped with suitable dopants, such as one or more p-type dopants. For example, the semiconductor material can be doped by ion implanting with p-type dopants such as boron, aluminum, nitrogen, gallium, indium, and/or combinations thereof. Next, top portions of the semiconductor material can be doped by ion implanting with n-type dopants such as phosphorus, arsenic, antimony, bismuth, lithium, and/or combinations thereof. As shown in FIG. 9D, the top portion of the semiconductor material doped with n-type dopants can form top contact 926, and the remaining portion of the semiconductor material between top contact 926 and cap layer 922 can form cylindrical body 924.

In some aspects, each cylindrical body 924 in one opening 920 is a pillar structure that extends in the vertical direction (e.g., z direction) and its sidewall is surrounded by dielectric stack 904. In some aspects, as shown in FIG. 9D, a top surface of cylindrical body 924 is at a horizontal plane that is above the top surface of the top second dielectric layer 908 of dielectric stack 904, and a bottom surface of cylindrical body 924 is at a horizontal plane that is below the bottom top surface of the bottom second dielectric layer 908 of dielectric stack 904.

Figure 9E:
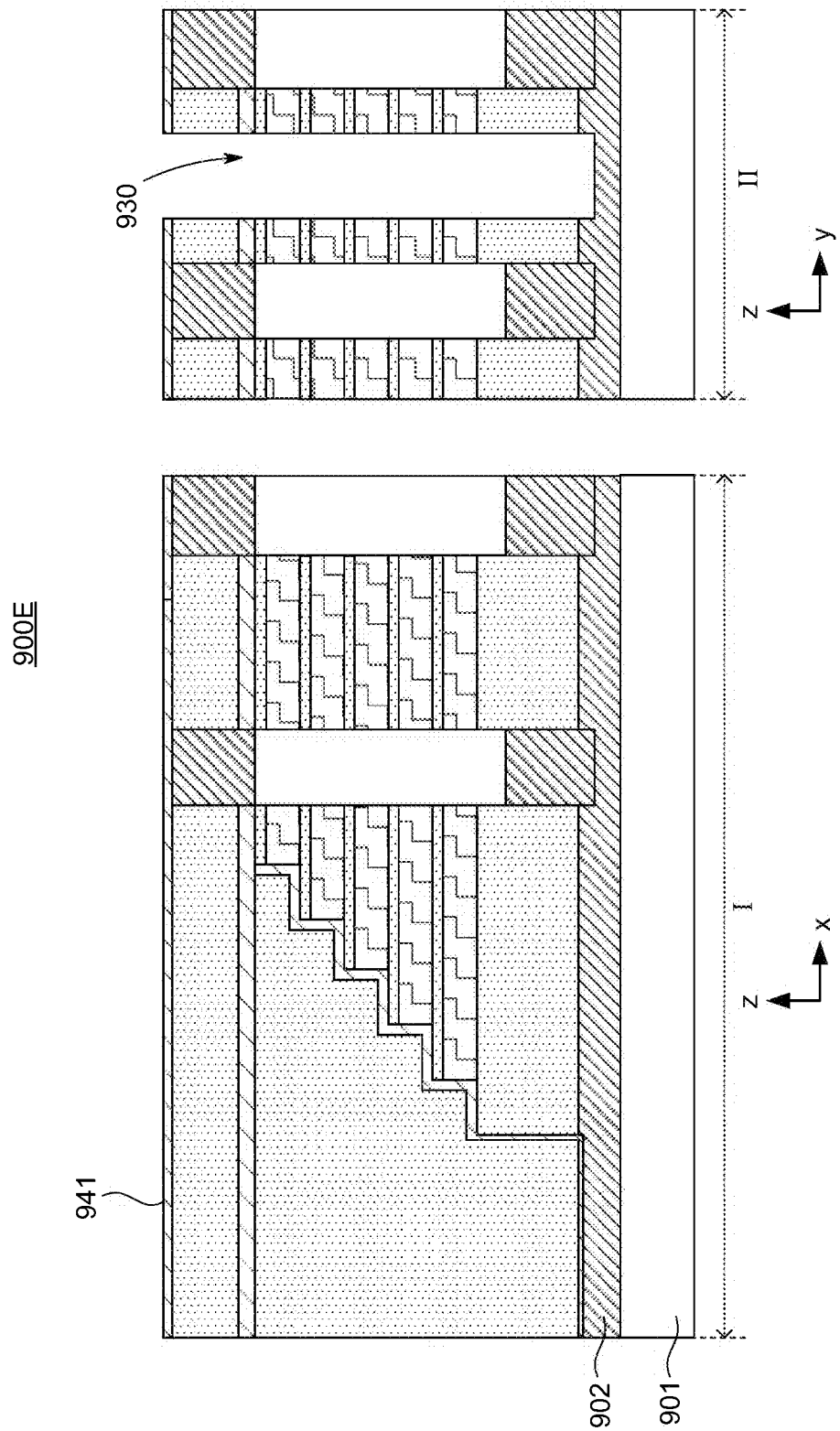

Method 800 can proceed to operation 810, in which at least one gate line slit can be formed in the dielectric stack, according to some aspects of the present disclosure. As shown in FIG. 9E, each gate line slit 930 can vertically penetrate through the dielectric stack 904, and laterally extend substantially in a straight line between two arrays of SGTs. The at least one gate line slit 930 can be formed by forming a mask layer 941 over the top isolation layer 914 and patterning the mask layer 941 using, e.g., photolithography, to form one or more openings corresponding to one or more gate line slits in the patterned mask layer 941. A suitable etching process, e.g., dry etch and/or wet etch, can be performed to remove portions of the dielectric stack 904 exposed by the openings until the multiple gate line slits 930 expose bottom conductive layer 902.

Figure 9F:
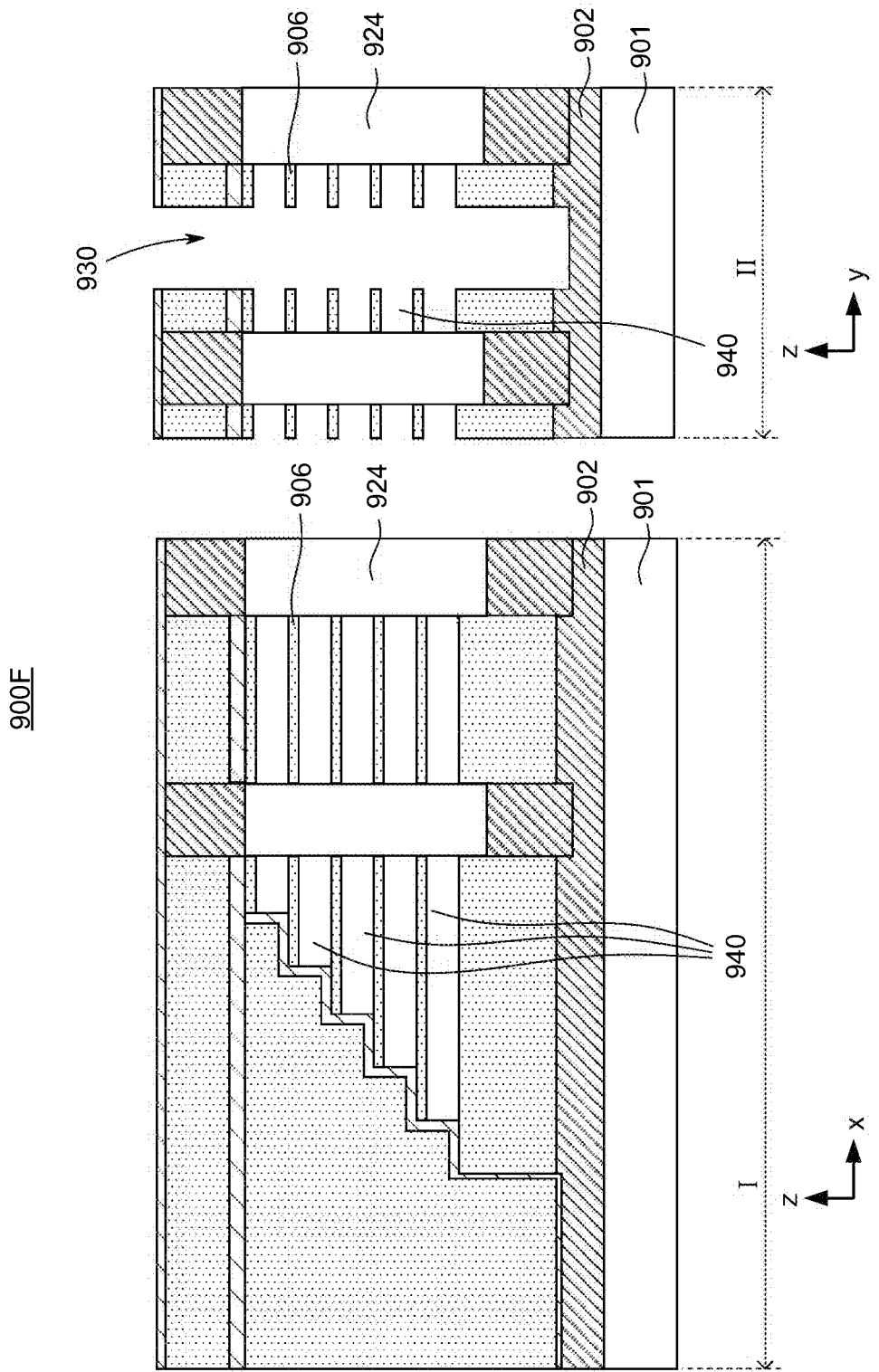

Method 800 can proceed to operation 812, in which the multiple second dielectric layers of dielectric stack can be removed to form multiple horizontal trenches. As shown in FIG. 9F, the multiple horizontal trenches 940 can extend in a horizontal direction. It is noted that, the term "horizontal/horizontally" used herein means nominally parallel to a lateral surface of substrate 901.

In some aspects, the second dielectric layers 908 of dielectric stack 904 are used as sacrificial layers, and are removed by used any suitable etching process, e.g., an isotropic dry etching process or an isotropic wet etching process. The etching process can have sufficiently high etching selectivity of the material of second dielectric layers 908 over the materials of the first dielectric layers 906, such that the etching process can have minimal impact on dielectric layers 906. The isotropic dry etch and/or the isotropic wet etch can remove second dielectric layers 908 in various directions to expose the top and bottom surfaces of each first dielectric layers 906. As such, multiple horizontal trenches 904 can then be formed between adjacent first dielectric layers 906.

In some aspects, the second dielectric layers 908 include silicon nitride and the etchant of the isotropic dry etching process includes one or more of $CF_4$, $CHF_3$, $C_4F_8$, $C_4F_6$, and $CH_2F_2$. The radio frequency (RF) power of the isotropic dry etching process can be lower than about 100 W and the bias can be lower than about 10V. In some aspects, the second dielectric layers 908 include silicon nitride and the etchant of the isotropic wet etching process includes phosphoric acid, such as $H_3PO_4$.

After second dielectric layers 908 are removed, the at least one gate line slit 930 and the multiple horizontal trenches 940 can be cleaned by using any suitable cleaning process. For example, a wet etch cleaning process can be performed to remove native oxide at the bottom of the at least one gate line slit 930 and a dry etch cleaning process can be performed to remove polymer and by-products on the sidewall of the at least one gate line slit 930. After the cleaning process, the top surfaces and bottom surfaces of first dielectric layers 906, and portions of the outside sidewalls of cylindrical body 924 originally surrounded by second dielectric layers 908 can be exposed through the multiple horizontal trenches 940, as shown in FIG. 9F.

Figure 9G:
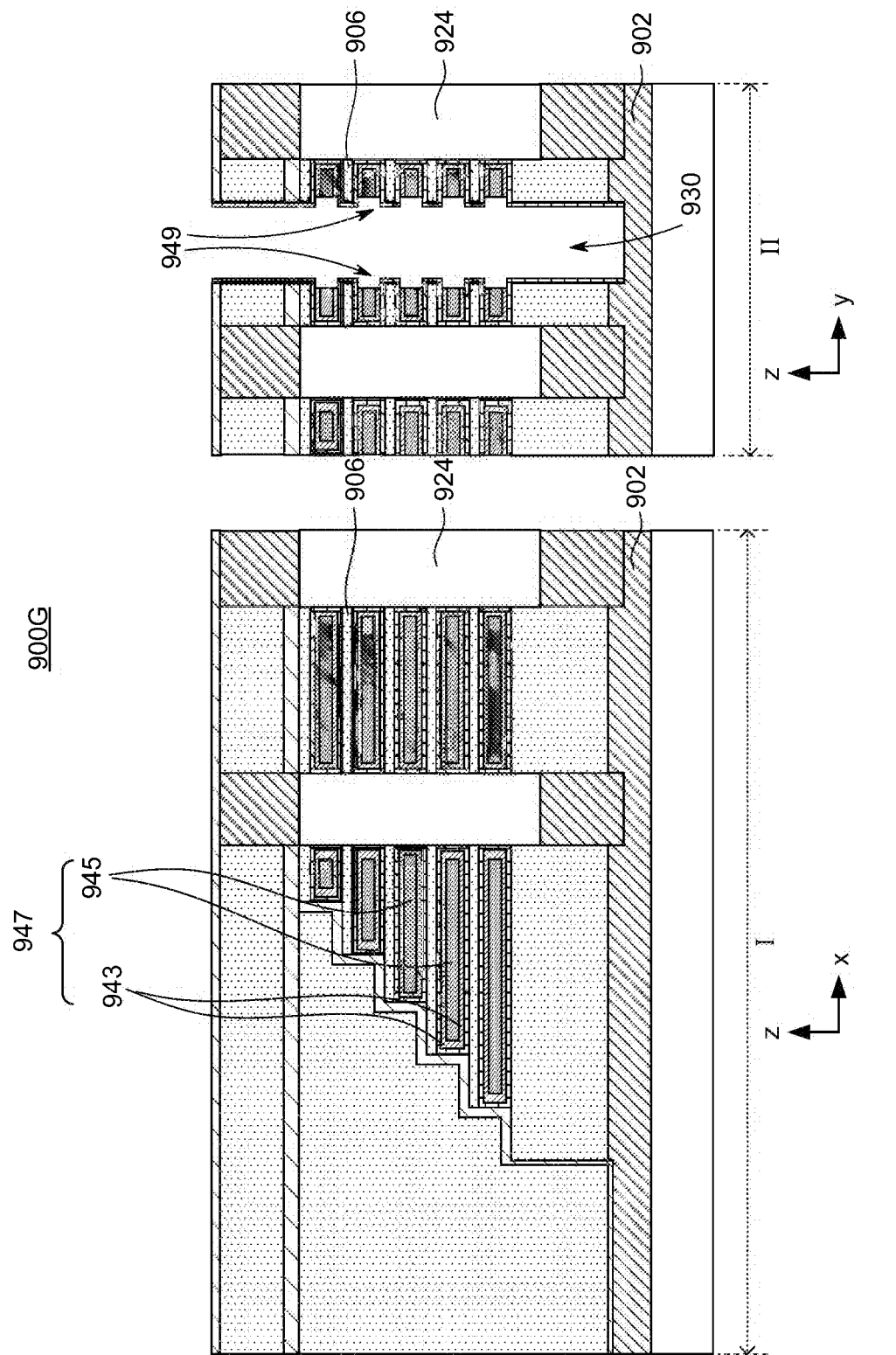

Method 800 can proceed to operation 814, in which gate structures can be formed in the multiple horizontal trenches. As shown in FIG. 9G, each gate structure 947 can include an gate insulating layer 943 and a gate electrode layer 945 wrapped by the gate insulating layer 943.

In some aspects, the gate insulating layer 943 can be formed on the internal surfaces of each of the multiple horizontal trenches 940. The gate insulating layer can be a dielectric layer for insulating the respective gate electrodes formed in the subsequent processes between the adjacent first dielectric layer 906. In some aspects, the gate insulating layer 943 can be formed to cover the exposed surfaces of the horizontal trenches 940 and/or the sidewalls of each gate line slit 930 with one or more suitable insulating materials. For example, one or more suitable deposition processes, such as CVD, PVD, and/or ALD, can be utilized to deposit the one or more insulating materials into the horizontal trenches 940. In some aspects, a recess etch and/or a chemical-mechanical planarization (CMP) can be used to remove excessive insulating material(s). The one or more insulating materials can include any suitable materials that provide electric insulating function. For example, the one or more insulating materials can include silicon oxide, silicon nitride, silicon oxynitride, aluminum oxide, titanium nitride, etc., and/or any suitable combinations thereof. In some aspects, multiple insulating layers can have different insulating materials.

In some aspects, the gate insulating layer 943 can have a laminated structure. For example, the insulating layer can include a first insulating sub-layer covering the top surfaces and bottom surfaces of the first dielectric layers 906, and the outside sidewall portions of cylindrical body 924 that are exposed by the multiple horizontal trenches 940. The gate insulating layer 943 can further include a second insulating sub-layer covering the surfaces of the first insulating sub-layer. In some aspects, the first insulating sub-layer can include high dielectric constant (high k-value) dielectrics (e.g., aluminum oxide), and the second insulating sub-layer can include titanium nitride as a glue layer to prevent gate electrode layers from peeling.

In some other aspects, the gate insulating layer 943 can be a single film structure. For example, the insulating layer can include a single high k-value dielectric layer (e.g., titanium nitride film) covering the top surfaces and bottom surfaces of the first dielectric layers 906, and the outside sidewall portions of cylindrical body 924 that are exposed by the multiple horizontal trenches 940. A thickness of the titanium nitride film can be in a range from about 1 nm to about 10 nm.

In some aspects, a gate electrode layer 945 can be then formed in each horizontal trench 940. The gate electrode layers 945 can be formed by filling the horizontal trenches 940 with any suitable conductive material, e.g., tungsten, aluminum, copper, cobalt, or any combination thereof. The gate electrode layer 945 can be deposited into horizontal trenches 940 using a suitable deposition method such as CVD, physical vapor deposition (PVD), plasma-enhanced CVD (PECVD), sputtering, metal-organic chemical vapor deposition (MOCVD), and/or ALD. In some aspects, the gate electrode layer 945 include tungsten formed by CVD.

In some aspects, after forming the multiple gate electrode layer 945, portions of the multiple gate electrode layer 945 can be removed by a recess etching process. In some aspects, in order to ensure the insulation between multiple gates, a recess etching process, such as a wet etching process, can be performed to remove the exposed portions of the multiple gate electrode layer 945 that are adjacent to gate line slit 930. In doing so, a recess 949 can be formed in each horizontal trench 940 adjacent to the sidewalls of gate line slit 930, as shown in FIG. 9G. The remaining portions of the multiple gate electrode layers 945 each is sandwiched by the gate insulating layer 943.

Method 800 can proceed to operation 816, in which a gate line slit structure can be formed in each gate line slit. In some aspects as shown in FIG. 9H, gate line slit structure 950 can include at least one spacer layer 935 and at least one gate line conductive structure 956.

In some aspects, spacer layer 935 having a laminated structure can be formed on the sidewalls of the at least one gate line slit 930. Spacer layer 935 is also referred as a gate line spacer (GLSP) layer, and can include a first spacer sublayer 931 and a second spacer sublayer 933, as shown in FIG. 9H. Spacer layer 935 can be used to provide electrical insulation between the multiple gate electrode layers 945 and the gate line conductive structure 956.

In some aspects, the fabricating process for forming spacer layer 935 can include forming the first spacer sublayer 931 on the sidewalls of the at least one gate line slit 930. As shown in FIG. 9H, the first spacer sublayer 931 can cover the sidewall of gate line slit 930, the exposed surfaces of the multiple gate structures 947. The first spacer sublayer 931 can be formed by using any suitable deposition process, such as an atomic layer deposition (ALD) process, to deposit a low temperature oxide material, such as silicon oxide. The first spacer sublayer 931 can be used to prevent the gate electrodes from being oxidized in the subsequent processes. In some aspects, a thickness of the first spacer sublayer 931 can be in a range from about 0.1 nm to about 10 nm.

Figure 9H:
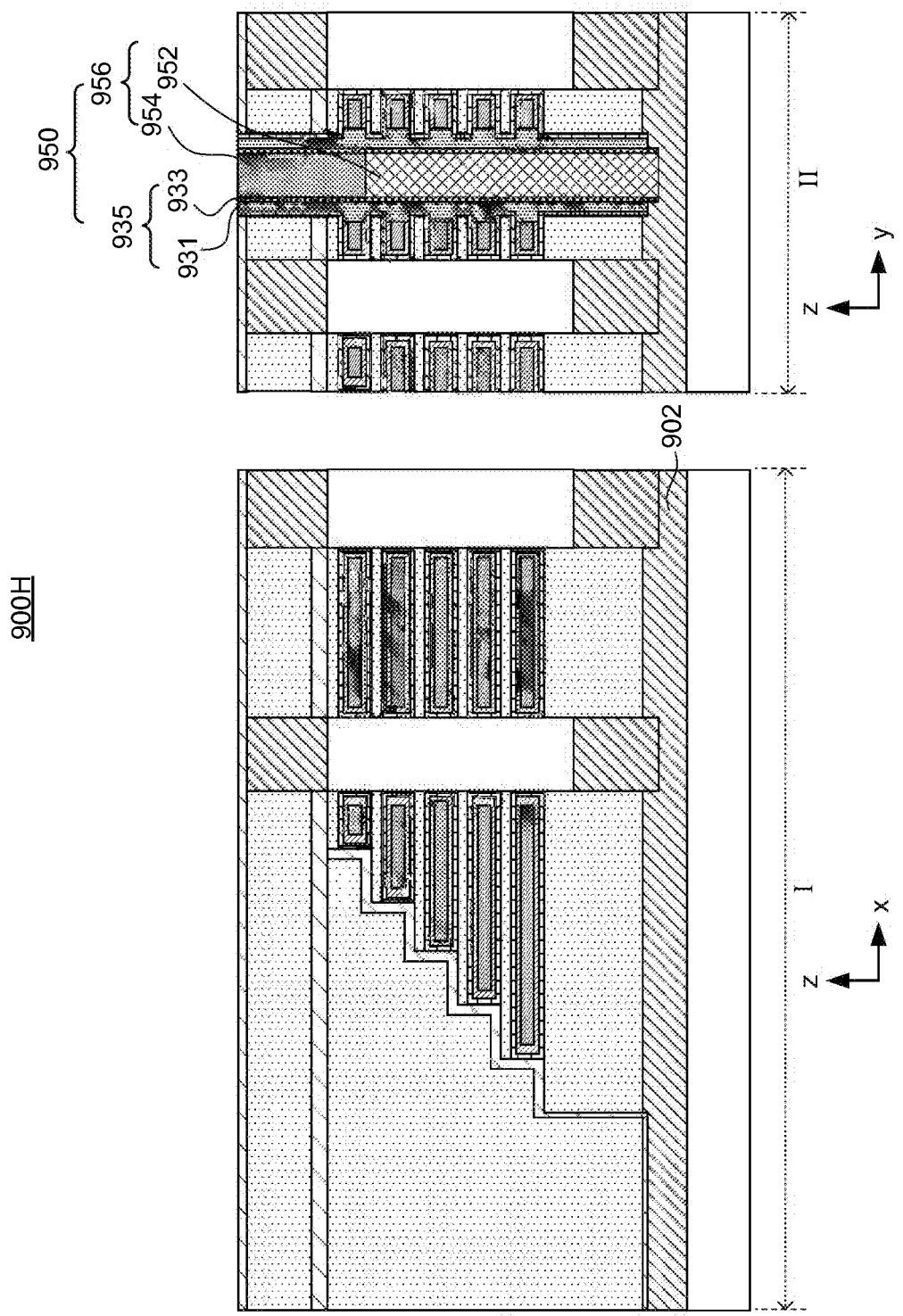

In some aspects, the fabricating process for forming spacer layer 935 can include forming the second spacer sublayer 933 to cover the first spacer sublayer 931, as shown in FIG. 9H. The second spacer sublayer 933 can be formed by using any suitable deposition process, such as an atomic layer deposition (ALD) process, to deposit a high k-value material, such as a dielectric material having a k-value larger than 5. For example, the second spacer sublayer 933 can be a nitride material, such as a silicon nitride layer. In some aspects, a thickness of the second spacer sublayer 933 can be in a range from about 1 nm to about 10 nm.

In some aspects, the laminated structure of spacer layer 935 can efficiently increase the equivalent oxide thickness (EOT) of the spacer layer 935, thereby improving the isolation performance of the spacer layer 935. For example in some aspects, an EOT of spacer layer 935 can be in a range from 40 nm to 100 nm. Thus, the improved film quality of the spacer layer 935 can result in a higher breakdown voltage between the gate structures 947 and the common source (e.g., gate line conductive structure 956).

In some aspects, the gate line conductive structure 956 can be formed in each gate line slit 930 and be sandwiched between second spacer sublayer 933. In some aspects, the gate line conductive structure 956 can be formed by depositing any suitable conductive material using any suitable deposition method such as CVD, physical vapor deposition (PVD), plasma-enhanced CVD (PECVD), sputtering, metal-organic chemical vapor deposition (MOCVD), and/or ALD. In some aspects, the gate line conductive structure 956 can include a semiconductor lower portion 952 and a metal upper portion 954, as shown in FIG. 9H. In one example, the semiconductor lower portion 952 can include polysilicon, and the metal upper portion 954 can include tungsten, aluminum, or copper.

The gate line conductive structure 956 is in contact with the bottom conductive layer 902 at the bottom of each gate line slit 930, and can be used as a common source contact of the multiple SGTs. After forming the gate line conductive structure 956, a chemical-mechanical planarization (CMP) process can be performed to planarize the top surface of the gate line slit structure 950 to be coplanar with the top surface of mask layer 941, as shown in FIG. 9H.

Figure 9I:
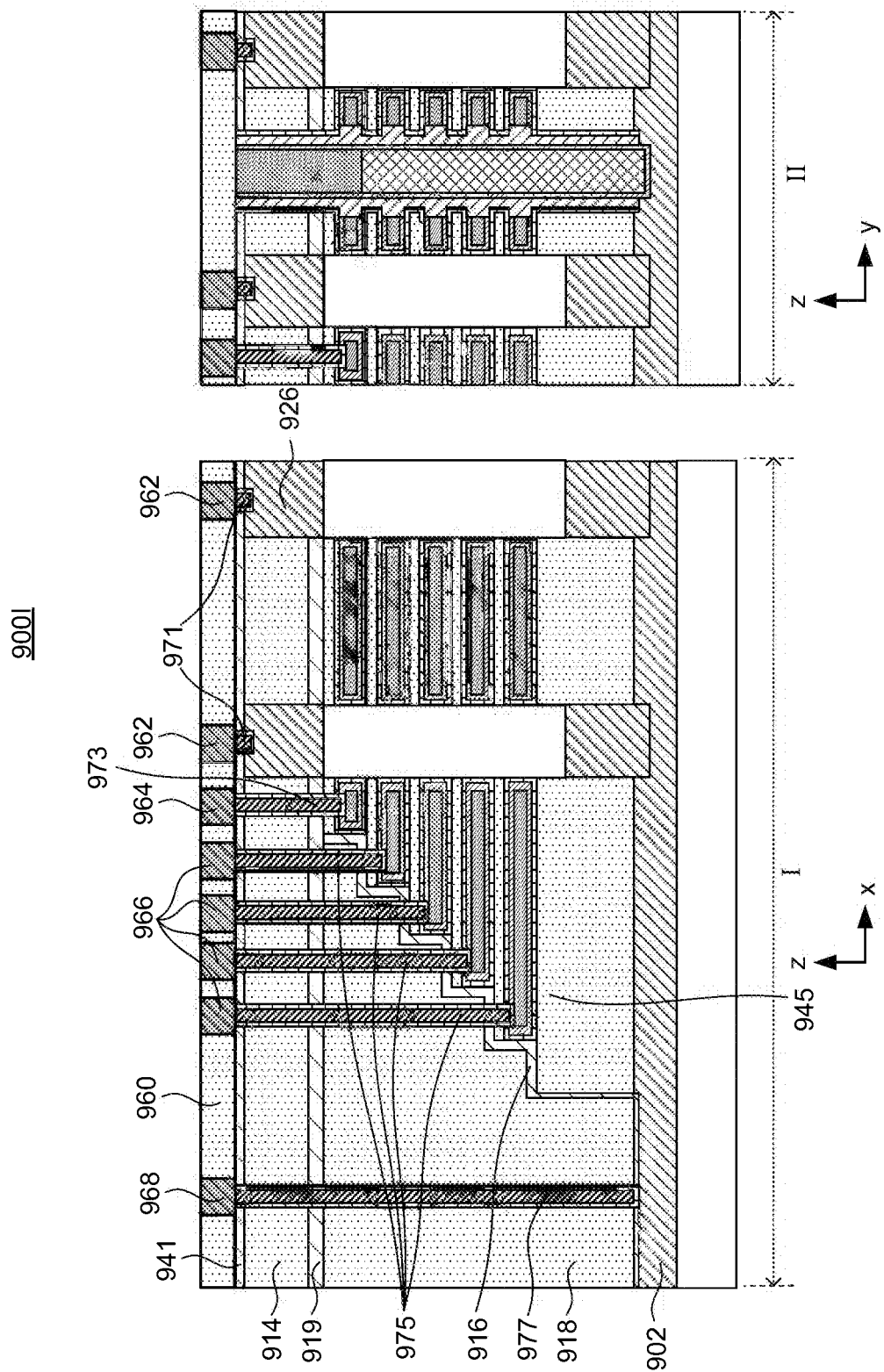

Method 800 can proceed to operation 818, in which multiple interconnect structures of the memory cells can be formed, according to some aspects of the present disclosure. As shown in FIG. 9I, the multiple interconnect structures can include a plurality of vias 971, 973, 975, 977 and a plurality of plugs 962, 964, 966, 968.

In some aspects, vias 971 can extend through mask layer 941, and electrically coupled to top contact 926. Via 971 can be used as the bit line (e.g., BL 120, 220 described above in connection with FIGS. 1-6). In some aspects, vias 973 and 975 can extend through mask layer 941, top isolation layer 914, etch stop layer 919, filling structure 918, and staircase insulating layer 916. Via 973 electrically coupled to top gate electrode layer 945 can be used as the word line (e.g., WL 142, 242 described above in connection with FIGS. 1-6). Vias 975 electrically coupled to other gate electrode layers 945 respectively can be used as the plate lines (e.g., PLs 346, 446, 546, 646 described above in connection with FIGS. 3-6). In some aspects, vias 977 can extend through mask layer 941, top isolation layer 914, etch stop layer 919, filling structure 918, and staircase insulating layer 916. In some aspects, vias 977 electrically coupled to bottom conductive layer 902 can be used as the source line (e.g., SL 130, 230 described above in connection with FIGS. 1-6).

In some aspects, plugs 962, 964, 966, and 968 can be formed in insulating layer 960 and electrically coupled to corresponding one of vias 971, 973, 975, 977. Plugs 962, 964, 966, and 968 can be respectively in contact with and electrically coupled to corresponding bottom conductive layer 902, gate electrode layer 945, or top contact 926 through vias 971, 973, 975, 977 for providing voltage bias and/or transmitting electrical signals. In some aspects, plugs 962, 964, 966, and 968 can be portions of a patterned conductive layer embedded in the insulating layer 960 and formed by any suitable patterning process. In some aspects, multiple plugs 966 can be interconnected with each other and coupled to a single voltage supply, such that multiple PLs share a common voltage configuration, as described above in connection with FIGS. 3-4. In some alternative aspects, multiple plugs 966 can be respectively coupled to multiple independent voltage supplies, such that multiple PLs are applied to independent voltages, as described above in connection with FIGS. 5-6.

Figure 10:
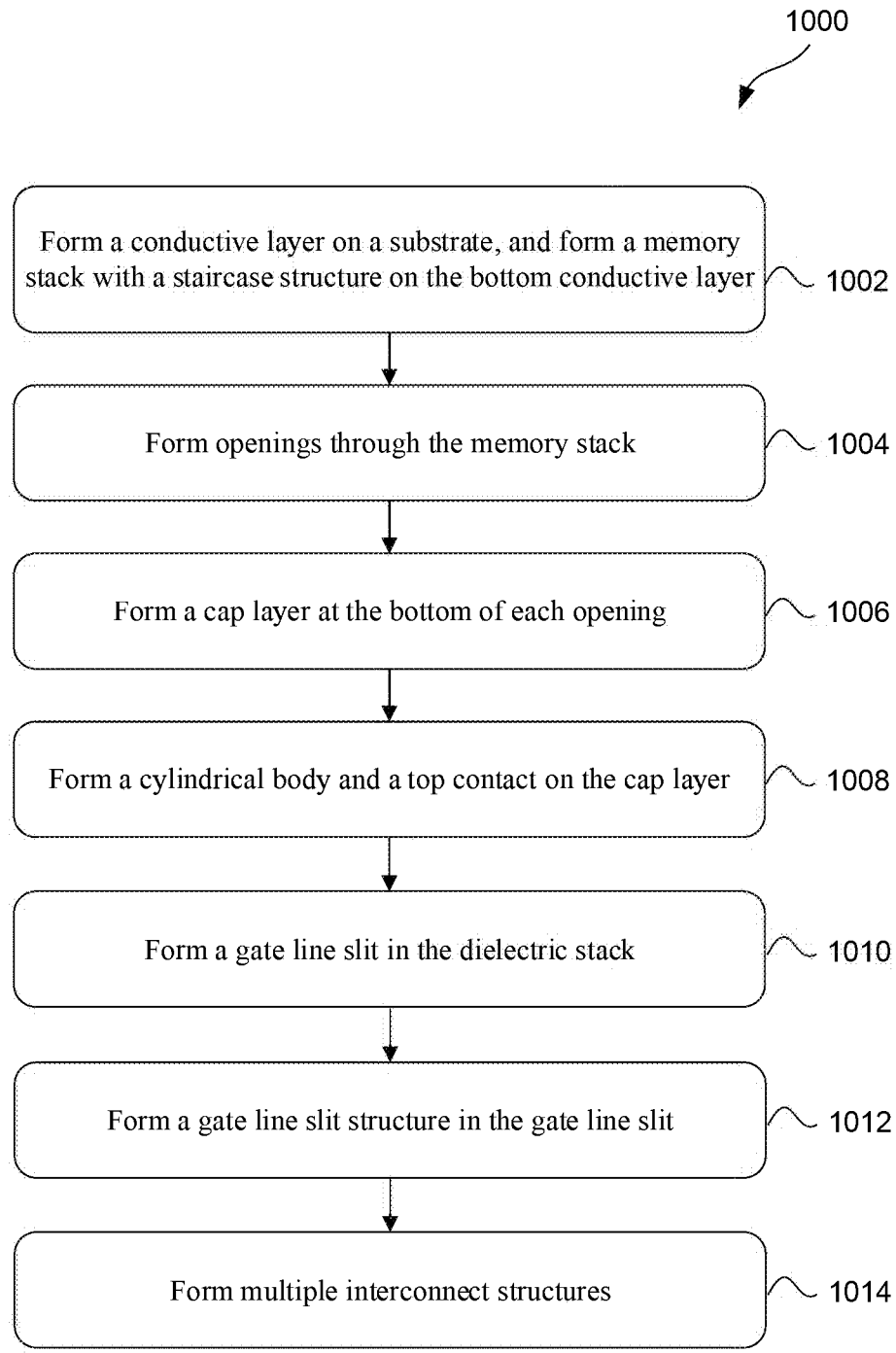
FIG. 10 is a flow diagram for another manufacturing process forming a 3D memory structure, according to some other exemplary aspects.

FIG. 10 illustrates another method for forming a 3D memory structure in accordance with some alternative aspects of the present disclosure. The operations of method 1000 can be performed in a different order and/or vary, and method 1000 can include more operations that are not described for simplicity. That is, not all operations in FIG. 10 are needed to perform the disclosure provided herein. Further, some of the operations may be performed simultaneously, sequentially, and/or in a different order than shown in FIG. 10. FIGS. 11A-11G are cross-sectional views of fabricating an exemplary 3D memory structure. FIGS. 11A-11G are provided as exemplary cross-sectional views to facilitate in the explanation of method 1000. The fabrication processes provided here are exemplary, and alternative processes in accordance with this disclosure may be performed that are not shown in these figures. Additional layers and/or structures can be formed in 3D memory structure and are not illustrated in FIGS. 11A-11G for simplicity.

Figure 11A:
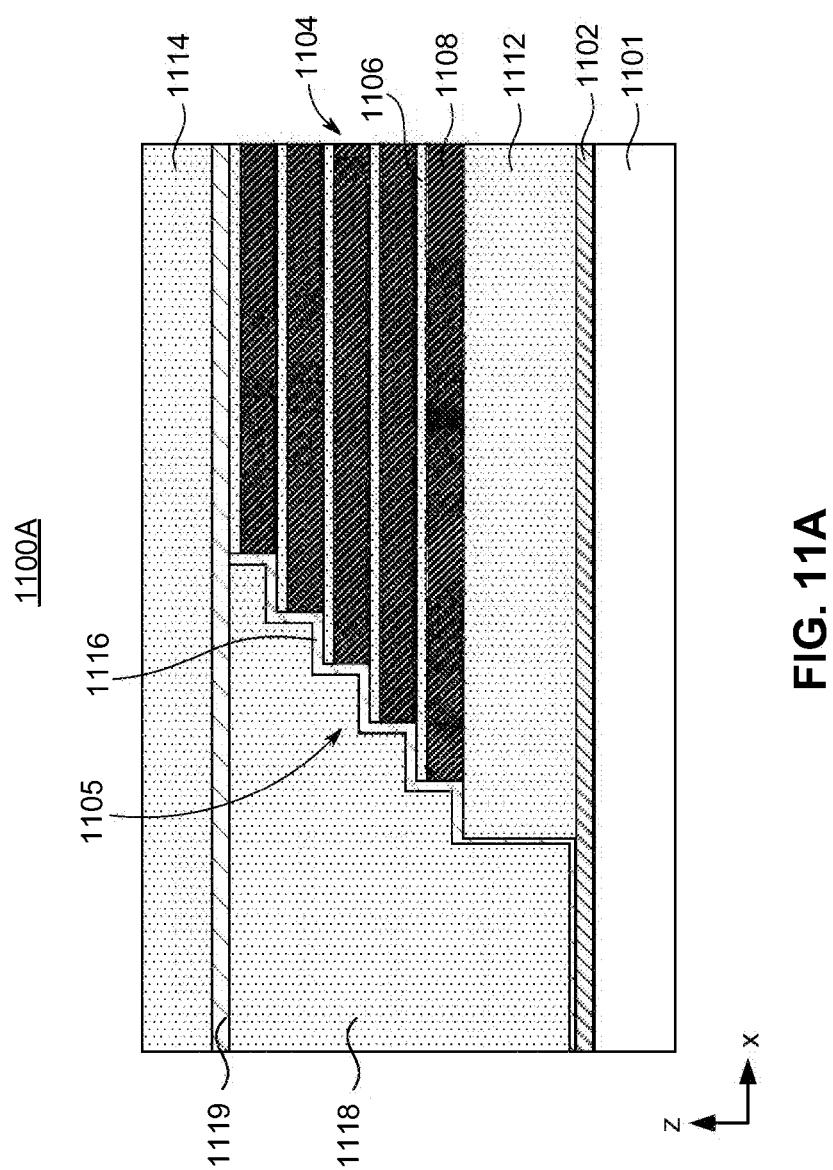
FIGS. 11A-11G are cross-sectional views of a 3D memory structure at certain stages of the manufacturing process of FIG. 8, according to some other exemplary aspects.

Method 1000 can begin at operation 1002, in which a bottom conductive layer can be formed on a substrate, and a memory stack with a staircase structure can be formed on the conductive layer, according to some aspects of the present disclosure. As shown in the example of FIG. 11A, memory stack 1104 with staircase structure 1105 including dielectric layers 1106 (e.g., silicon oxide) and conductive layers 1108 (e.g., tungsten, aluminum, copper, cobalt, or any combination thereof) can be formed as an dielectric stack atop bottom conductive layer 1102, which is formed atop substrate 1101.

Substrate 1101 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some aspects, substrate 1101 can include a dielectric layer (not shown), such as silicon oxide, silicon nitride, silicon oxynitride, and the like. In some aspects, substrate 1101 can be a semiconductor layer doped with suitable dopants. For example, substrate 1101 can be doped with p-type dopants (e.g., boron, indium, aluminum, gallium, etc., and/or combinations thereof).

Bottom conductive layer 1102 can be formed on substrate 1101. Bottom conductive layer 1102 can extend in a lateral direction that is parallel to a top surface of substrate 1101. In some aspects, bottom conductive layer 1102 can be a conductive structure, such as a metal line or a semiconductor layer doped with suitable dopants. For example, bottom conductive layer 1102 can be formed of tungsten, cobalt, copper, aluminum, any suitable metal, and/or combinations thereof. Bottom conductive layer 1102 can be disposed using thin-film deposition processes including, but not limited to, chemical vapor deposition (CVD), plasma-enhanced CVD (PECVD), physical vapor deposition (PVD), atomic layer deposition (ALD), plasma-enhanced ALD (PEALD), and/or any combinations thereof. As another example, bottom conductive layer 1102 can be formed of the same semiconductor material of substrate 1101 but doped with opposite type of dopants. When substrate 1101 is doped with p-type dopants, bottom conductive layer 1102 can be doped with n-type of dopants (e.g., phosphorus, arsenic, antimony, bismuth, lithium, etc., and/or combinations thereof).

A memory stack 1104 including a plurality of dielectric layers 1106 and conductive layers 1108 can be formed on bottom conductive layer 1102. The plurality of dielectric layers 1106 and conductive layers 1108 are extended in the lateral direction, and alternate along a vertical direction that is perpendicular to the top surface of substrate 1101. In some aspects, dielectric layers 1106 can be silicon oxide layers, and conductive layers 1108 can be metal layers. Memory stack 1104 can be formed by multiple thin film deposition processes including, but not limited to, Chemical Vapor Deposition (CVD), Physical Vapor Deposition (PVD), Atomic Layer Deposition (ALD), high-density-plasma CVD (HDP-CVD), sputtering, spin-coating, and/or any combinations thereof.

Conductive layers 1108 can form WL contact and PL contact segments. For example, the top conductive layer 1108 can be used as the WL contact, and the other conductive layers 1108 below the top conductive layer 1108 can be used as a plurality of PL contact segments. In some aspects, the plurality of conductive layers 1108 can have a same thickness Lg between about 5 nm and about 100 nm, such as about 10 nm, about 15 nm, or about 20 nm. In some aspects, the plurality of dielectric layers 1106 can have a same thickness or different thicknesses. For example, the top dielectric layer 906 beneath and adjacent to the top conductive layer 1108 can have a second thickness Ts2 that is different from a first thickness Ts1 of the rest dielectric layer 1106 below the top dielectric layer 1106. In some aspects, first thickness Ts1 can be in a range between about 5 nm and about 200 nm, and second thickness Ts2 can be in a range between about 5 nm and about 200 nm. In some aspects, memory stack 1104 can further include bottom isolation layer 1112 (e.g., a silicon oxide layer) having a thickness H greater than Lg, Ts1 and Ts2.

A staircase structure 1105 can be formed on one edge of memory stack 1104. In some aspects, portions of memory stack 1104 can be removed to form a staircase structure 1105. In some aspects, multiple etch-trim processes can be performed repeatedly to form a set of steps of staircase structure 1105. In some aspects, each step can include at least one dielectric layer 1106 and at least one conductive layer 1108.

In some aspects, the etch-trim processes can include a set of repeating etch-trim processes to form the staircase structure 1105 including a set of steps at the edge of memory stack 1104. Specifically, for forming each step, a photoresist layer (not shown) can be used as a mask to expose a portion of the top surface of memory stack 1104. For forming the first step, a width of the exposed top surface of memory stack 1104 can be a step width. In some aspects, an anisotropic etching process, such as a reactive ion etching (RIE) process, or other suitable dry/wet etching process, can be performed to remove the exposed layer (e.g., conductive layer 1108) that is exposed through the mask (i.e., the photoresist layer). The etching process can stop on the next lower layer (e.g., dielectric layer 906). The pattern in the mask (i.e., the photoresist layer) is then transferred to the layer (e.g., conductive layer 1108) that has been etched. The exposed next lower layers (e.g., dielectric layers 1106) can be then removed by another etching process that stops on the next lower layers (e.g., conductive layer 1108). As such, the first step can be created on the first two top layers of memory stack 1104.

Next, the mask (i.e., the photoresist layer) can be reduced in size by removing a portion of the mask (also known as "trimming") above memory stack 1104, such as by an isotropic etching process, to expose another step width of memory stack 1104. The method can proceed by subjecting the structure to two anisotropic etching processes, including removing exposed portions of the two exposed layers (e.g., two conductive layers 1108), and subsequently removing exposed portions of the two exposed next lower layers (e.g., dielectric layers 1106). As such, the first step can be lowered to the third and fourth top layers of memory stack 1104, and a second step can be formed on the first two top layers of memory stack 1104.

In some aspects, the successive reduction in size of the mask (i.e., the photoresist layer) and the two-step etching processes (also referred as etch-trim processes) can be repeated such that the staircase structure 1105 including a set of steps can be formed on one edge of memory stack 1104, as shown in FIG. 11A. The photoresist layer can be then removed. In some aspects, the removal process can include any suitable etching processes and cleaning processes. In some aspects, a staircase insulating layer 1116 and a filing structure 1118 can be formed to cover the exposed surfaces of staircase structure 1105, an etch stop layer 1119 and an top isolation layer 1114 can be formed on filling structure 1118 and memory stack 1104.

Figure 11B:
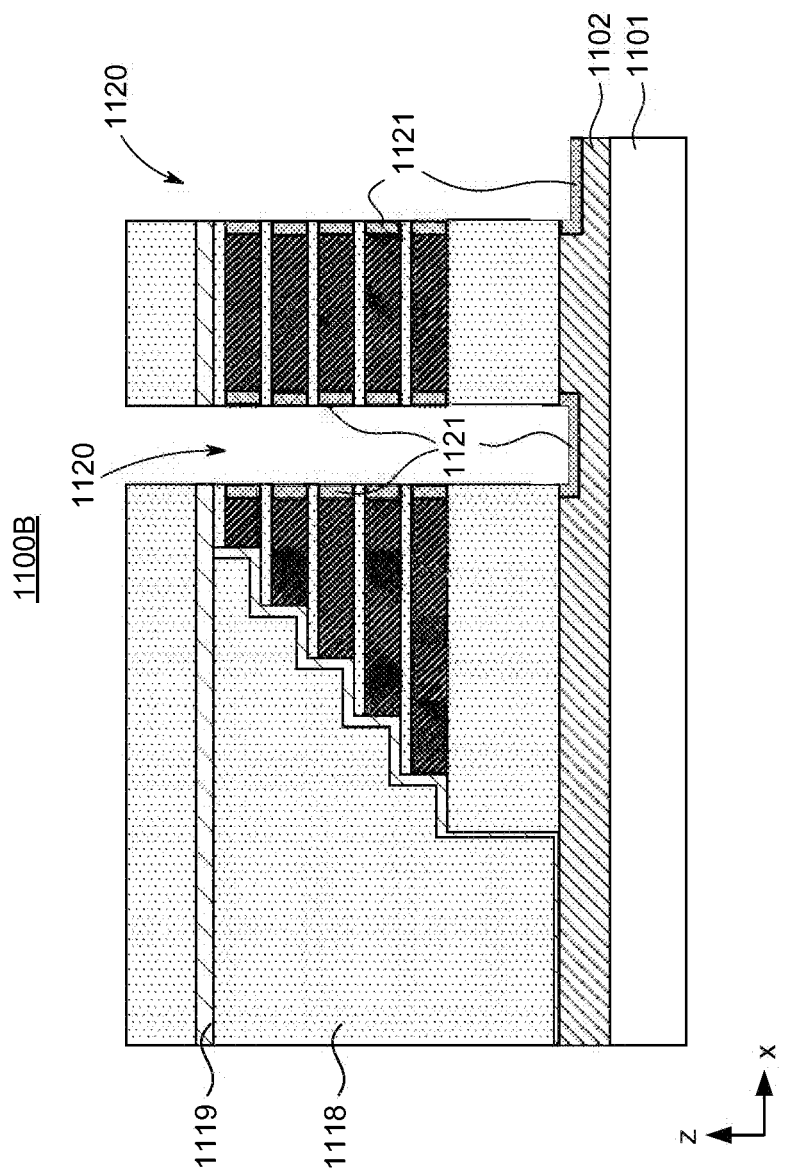

Method 1000 can proceed to operation 1004, in which openings can be formed through the memory stack, according to some aspects of the present disclosure. Referring to FIG. 11B, openings 1120 can be formed by etching portions of top isolation layer 1114, etch stop layer 1119, and memory stack 1104 until bottom conductive layer 1102 is exposed.

In some aspects, openings 1120 can be a cylindrical hole having a substantially rectangular cross-sectional area. A photolithography process can be used to expose portions of the top surface of top isolation layer 1114 to be etched.

Anisotropic etching, such as dry plasma etching processes or wet chemical etching processes, can be used to sequentially remove portions of top isolation layer 1114, etch stop layer 1119, and memory stack 1104 until bottom conductive layer 1102 is exposed. The etching processes can include multiple etching processes, each configured to remove the type of material that is exposed. Specifically, the etchants used in each etching process can be selected based on the material composition of top isolation layer 1114, etch stop layer 1119, dielectric layers 1106, conductive layers 1108, and bottom isolation layer 1112. The etching processes can continue until a top surface of bottom conductive layer 1102 is exposed. In some aspects, openings 920 extend into bottom conductive layer 1102 to ensure that conductive layer 1102 is exposed within openings 1120. Masking layers such as photoresists can be removed after openings 1120 are formed. In some aspects, an oxidation process can be performed to oxidize exposed surfaces of conductive layers exposed by opening 1120 to form oxide layers 1121, as shown in FIG. 11B.

Method 1000 can proceed to operation 1006, in which a cap layer can be formed at the bottom of each opening, according to some aspects of the present disclosure.

Figure 11C:
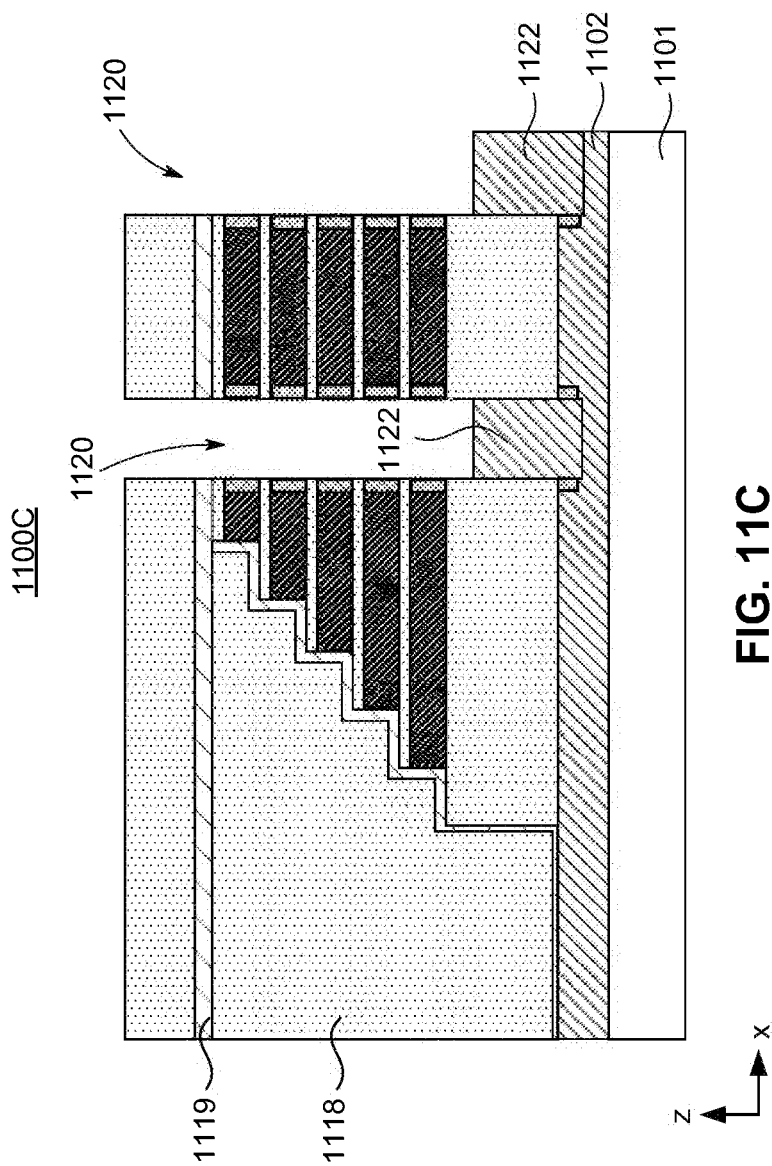

In some aspects, before forming cap layer 1122, a punch etch can be performed to remove a portion of the oxide layer 1121 at the bottom of each opening 1120 to expose bottom conductive layer 1102. As shown in FIG. 11C, cap layer 1122 can be formed at the bottom of each opening 1120, and can be doped with same dopants with bottom conductive layer 1102. For example, cap layer 1122 can be doped with n-type dopants (e.g., phosphorus, arsenic, antimony, bismuth, lithium, etc., and/or combinations thereof). Cap layer 1122 can be used as source cap (e.g., source cap 234 as shown in FIG. 2). Thus, a top surface of cap layer 1122 is lower than a top surface of bottom isolation layer 1112. In some aspects, a drop height D from the top surface of bottom isolation layer 1112 to the top surface of cap layer 1122 can be greater than 5 nm.

In some aspects, cap layer 1122 are grown by CVD, e.g., low pressure chemical vapor deposition (LPCVD), atomic layer chemical vapor deposition (ALCVD), ultra-high vacuum chemical vapor deposition (UHVCVD), remote plasma chemical vapor deposition (RPCVD); molecular beam epitaxy (MBE) processes; any suitable epitaxial process; or any combinations thereof. In some aspects, cap layer 1122 are grown by an epitaxial deposition/partial etch process, which repeats the epitaxial deposition/partial etch process at least once. Such repeated deposition/partial etch process is also called a cyclic deposition-etch (CDE) process. In some aspects, cap layer 1122 are grown by selective epitaxial growth (SEG), where an etching gas is added to promote the selective growth of semiconductor material on the exposed surfaces of substrate 1101, but not on insulating material (e.g., dielectric material of bottom isolation layer 1112). Further, cap layer 1122 may be in-situ doped during the epitaxial growth process or by an ion implantation process after the epitaxial growth process. In some aspects, cap layer 1122 may be doped with n-type dopants, such as phosphorus, arsenic, antimony, bismuth, lithium, etc., and/or combinations thereof.

Figure 11D:
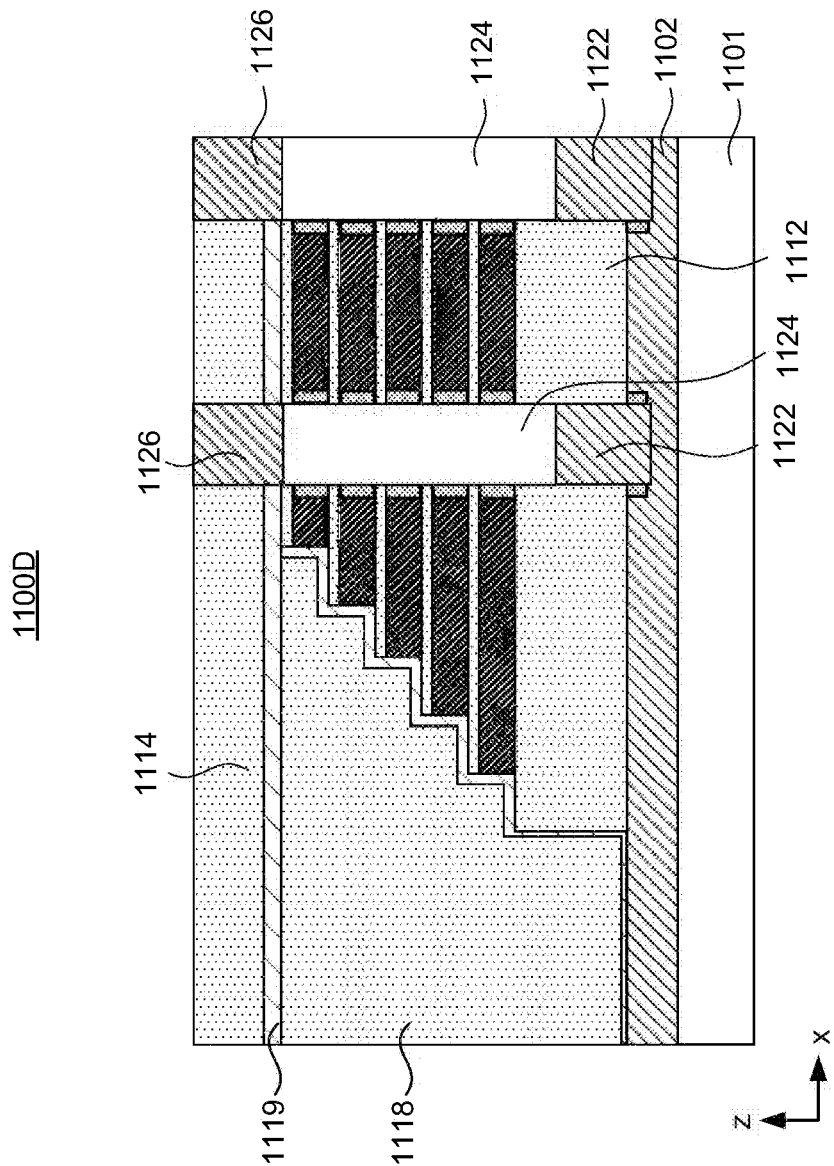

Method 1000 can proceed to operation 1008, in which a cylindrical body and a top contact can be formed in each opening and on the cap layer, according to some aspects of the present disclosure. As shown in FIG. 11D, a cylindrical body 1124 can be formed atop cap layer 1122 in each opening 1120, and a top contact 1126 can be formed atop on cylindrical body 1124 in each opening 1120.

In some aspects, forming floating cylindrical bodies 1124 and top contacts 1126 can include filling openings 1120 with a semiconductor material. For example, a semiconductor material can be filled into the openings 1120 by a patterned epitaxial growth process (e.g., SEG) or any suitable deposition method (e.g., CVD, PVD, ALD, etc.) and/or a recrystallization process. For example, a polysilicon structure can be epitaxially grown from cap layer 1122. As another example, an amorphous silicon structure can be deposited on cap layer 1122, and a heating process can transform the amorphous silicon structure to a polysilicon structure. In some aspects, the semiconductor material can extend through the entirety of openings 1120 and a planarization process is performed such that top surfaces of the semiconductor material are coplanar with the top surface of top isolation layer 1114. In some aspects, the semiconductor material can be formed using a silicon material, such as polysilicon material or single crystalline silicon material.

Floating cylindrical bodies 1124 and top contacts 1126 can be formed based on the semiconductor material. In some aspects, the semiconductor material can be an intrinsic material or doped with suitable dopants, such as one or more p-type dopants. For example, the semiconductor material can be doped by ion implanting with p-type dopants such as boron, aluminum, nitrogen, gallium, indium, and/or combinations thereof. Next, top portions of the semiconductor material can be doped by ion implanting with n-type dopants such as phosphorus, arsenic, antimony, bismuth, lithium, and/or combinations thereof. As shown in FIG. 11D, the top portion of the semiconductor material doped with n-type dopants can form top contact 1126, and the remaining portion of the semiconductor material between top contact 1126 and cap layer 1122 can form cylindrical body 1124.

In some aspects, each cylindrical body 1124 in one opening 1120 is a pillar structure that extends in the vertical direction (e.g., z direction) and its sidewall is surrounded by memory stack 1104. In some aspects, as shown in FIG. 9I1, a top surface of cylindrical body 1124 is at a horizontal plane that is above the top surface of the top conductive layer 1108 of memory stack 1104, and a bottom surface of cylindrical body 1124 is at a horizontal plane that is below the bottom top surface of the lowest conductive layer 1108 of memory stack 1104.

Figure 11E:
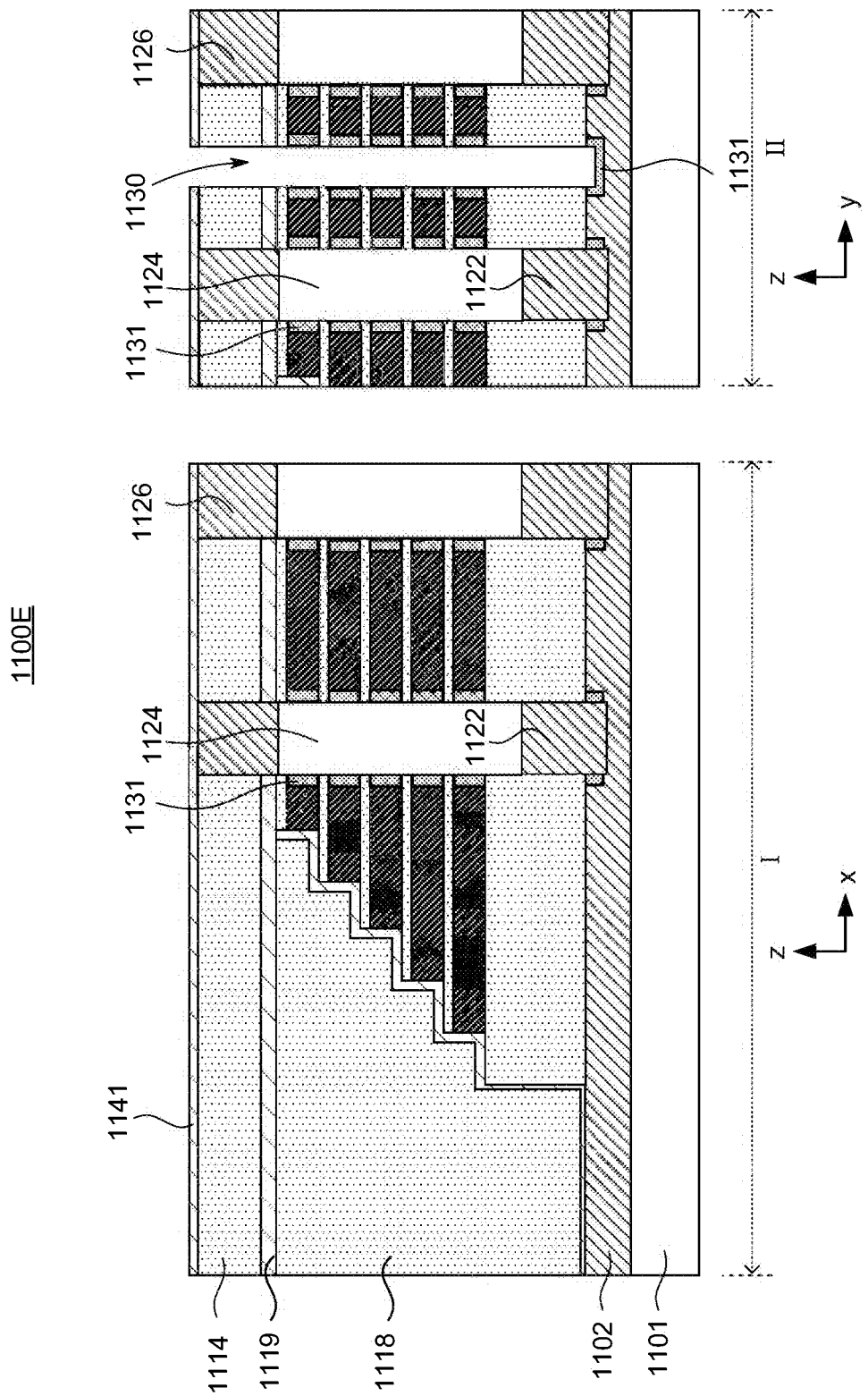

Method 1000 can proceed to operation 1010, in which at least one gate line slit can be formed in the dielectric stack, according to some aspects of the present disclosure. As shown in FIG. 11E, each gate line slit 1130 can vertically penetrate through the memory stack 1104, and laterally extend substantially in a straight line between two arrays of SGTs. The at least one gate line slit 1130 can be formed by forming a mask layer 1141 over the top isolation layer 1114 and patterning the mask layer 1141 using, e.g., photolithography, to form one or more openings corresponding to one or more gate line slits in the patterned mask layer 1141. A suitable etching process, e.g., dry etch and/or wet etch, can be performed to remove portions of the memory stack 1104 exposed by the openings until the at least one gate line slit 1130 exposes the bottom conductive layer 902. In some aspects, an oxidation process can be performed to oxidize exposed surfaces of conductive layers exposed by the at least one gate line slit 1130 to form oxide layers 1131, as shown in FIG. 11E.

Figure 11F:
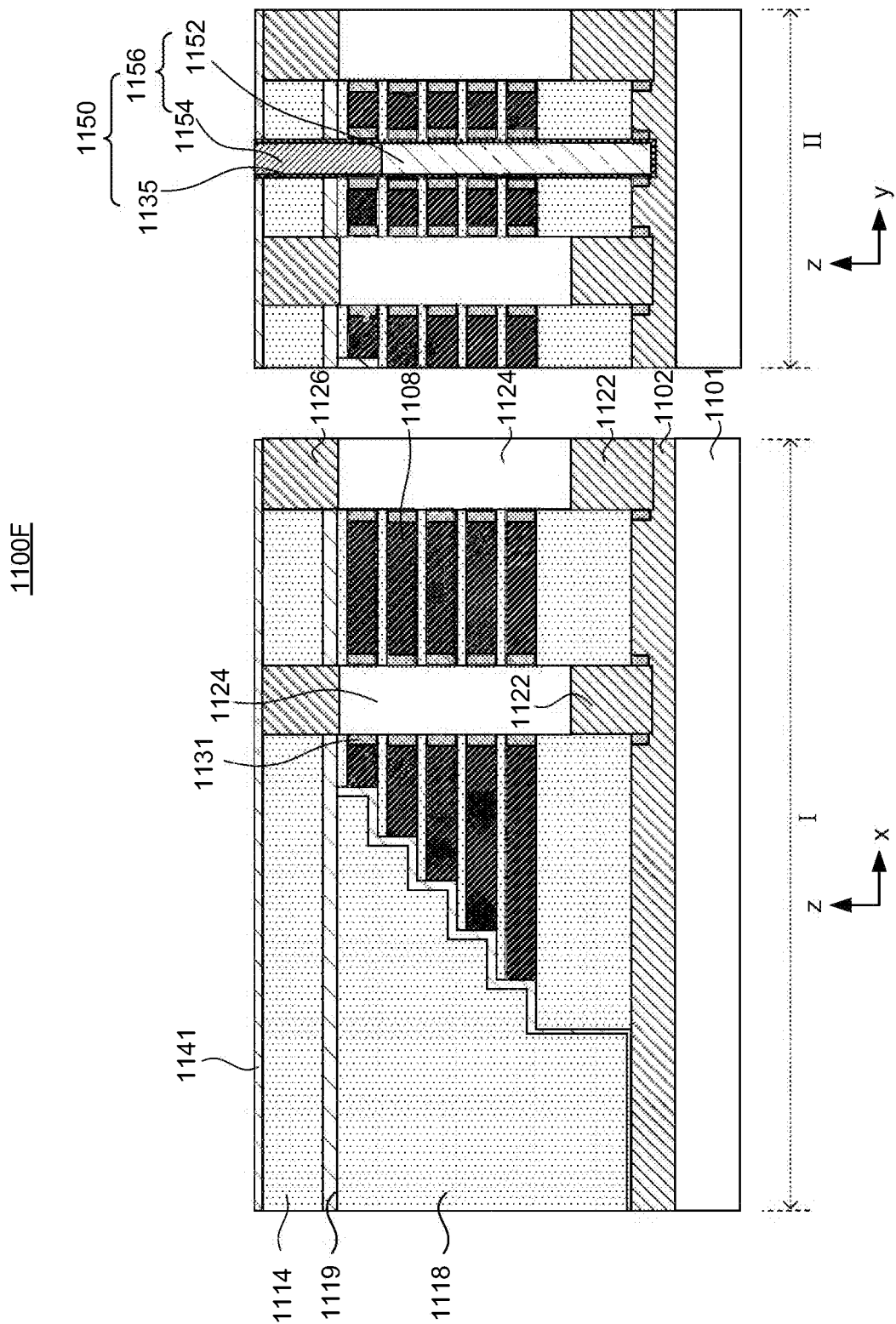

Method 1000 can proceed to operation 1012, a gate line slit structure can be formed in each gate line slit. In some aspects as shown in FIG. 11F, gate line slit structure 1150 can include at least one spacer layer 1135 and at least one gate line conductive structure 1156.

In some aspects, spacer layer 1135 having a single layer structure or a laminated structure can be formed on the sidewalls of the at least one gate line slit 1130. Spacer layer 1135, also referred as a gate line spacer (GLSP) layer, can be used to provide electrical insulation between the multiple conductive layers 1108 and the gate line conductive structure 1156.

In some aspects, the fabricating process for forming spacer layer 1135 can include forming one or more dielectric films on the sidewalls of the at least one gate line slit 1130. As shown in FIG. 11F, the spacer layer 1135 can cover the sidewall of gate line slit 1130 and the exposed surfaces of oxide layers 1131. The spacer layer 1135 can be formed by using any suitable deposition process, such as an atomic layer deposition (ALD) process. The spacer layer 1135 can include a low temperature oxide material, and/or a high k-value material. The spacer layer 1135 can be used to prevent the gate electrodes from being oxidized in the subsequent processes.

In some aspects, the gate line conductive structure 1156 can be formed in each gate line slit 1130 and be sandwiched between spacer layer 1135. In some aspects, the gate line conductive structure 1156 can be formed by depositing any suitable conductive material using any suitable deposition method such as CVD, physical vapor deposition (PVD), plasma-enhanced CVD (PECVD), sputtering, metal-organic chemical vapor deposition (MOCVD), and/or ALD. In some aspects, the gate line conductive structure 1156 can include a semiconductor lower portion 1152 and a metal upper portion 1154, as shown in FIG. 11F. In one example, the semiconductor lower portion 1152 can include polysilicon, and the metal upper portion 1154 can include tungsten, aluminum, or copper.

The gate line conductive structure 1156 is in contact with the bottom conductive layer 1102 at the bottom of each gate line slit 1130, and can be used as a common source contact of the multiple SGTs. After forming the gate line conductive structure 1156, a chemical-mechanical planarization (CMP) process can be performed to planarize the top surface of the gate line slit structure 1150 to be coplanar with the top surface of mask layer 1141, as shown in FIG. 11F.

Figure 11G:
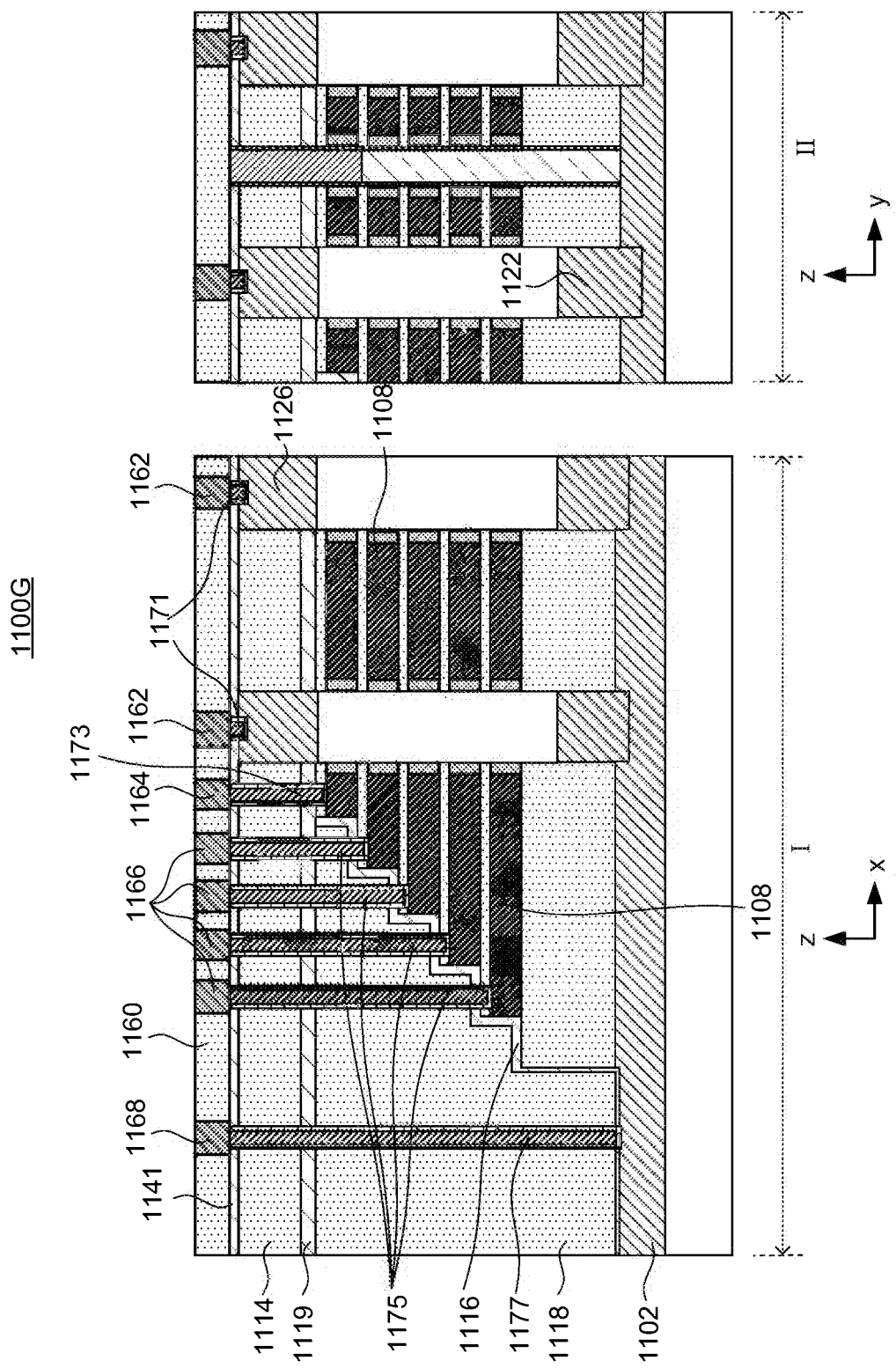

Method 1000 can proceed to operation 1014, in which multiple interconnect structures of the memory cells can be formed, according to some aspects of the present disclosure. As shown in FIG. 11G, the multiple interconnect structures can include a plurality of vias 1171, 1173, 1175, 117 and a plurality of plugs 1162, 1164, 116, 1168.

In some aspects, vias 1171 can extend through mask layer 1141, and electrically coupled to top contact 1126. Via 1171 can be used as the bit line (e.g., BL 120, 220 described above in connection with FIGS. 1-6). In some aspects, vias 1173 and 1175 can extend through mask layer 1141, top isolation layer 1114, etch stop layer 1119, filling structure 1118, and staircase insulating layer 1116. Via 1173 electrically coupled to top conductive layer 1108 can be used as the word line (e.g., WL 142, 242 described above in connection with FIGS. 1-6). Vias 1175 electrically coupled to other conductive layers 1108 respectively can be used as the plate lines (e.g., PLs 346, 446, 546, 646 described above in connection with FIGS. 3-6). In some aspects, vias 1177 can extend through mask layer 1141, top isolation layer 1114, etch stop layer 1119, filling structure 1118, and staircase insulating layer 1116. In some aspects, vias 1177 electrically coupled to bottom conductive layer 1102 can be used as the source line (e.g., SL 130, 230 described above in connection with FIGS. 1-6).

In some aspects, plugs 1162, 1164, 1166, and 1168 can be formed in insulating layer 1160 and electrically coupled to corresponding one of vias 1171, 1173, 1175, 1177. Plugs 1162, 1164, 1166, and 1168 can be respectively in contact with and electrically coupled to corresponding bottom conductive layer 1102, conductive layer 1108, or top contact 926 through vias 1171, 1173, 1175, 1177 for providing voltage bias and/or transmitting electrical signals. In some aspects, plugs 1162, 1164, 1166, and 1168 can be portions of a patterned conductive layer embedded in the insulating layer 1160 and formed by any suitable patterning process. In some aspects, multiple plugs 1166 can be interconnected with each other and coupled to a single voltage supply, such that multiple PLs share a common voltage configuration, as described above in connection with FIGS. 3-4. In some alternative aspects, multiple plugs 1166 can be respectively coupled to multiple independent voltage supplies, such that multiple PLs are applied to independent voltages, as described above in connection with FIGS. 5-6.

One aspect of the present disclosure provides a method for forming a memory structure, comprising: forming a bottom conductive layer on a substrate; forming a memory stack on the bottom conductive layer, the memory stack comprising a plurality of alternatively arranged dielectric layers and conductive layers; forming an opening penetrating the memory stack and exposing the bottom conductive layer; forming an cap layer on a bottom of the opening; forming a cylindrical body and a top contact on the cap layer and in the opening; and forming a plurality of interconnection structures to electrically connect the bottom conductive layer, the plurality of conductive layers of the memory stack, and the top contact.

In some embodiments, the method further comprises doping the bottom conductive layer and the cap layer with a first type of dopant.

In some embodiments, the method further comprises, before forming the cylindrical body and the top contact, performing an oxidation process to treat exposed surface of the plurality of conductive layers of the memory stack and the bottom conductive layer to form an oxide layer.

In some embodiments, the method further comprises, before forming the cylindrical body and the top contact, performing a punch etch to remove the oxide layer on the bottom conductive layer to expose the conductive layer.

In some embodiments, forming the cylindrical body and the top contact comprises: forming a semiconductor structure on the cap layer to fill the opening; doping the semiconductor structure with a second type of dopant opposite to the first type of dopant; and doping a top portion of the semiconductor structure with the first type of dopant, such that the top portion of the semiconductor structure form the top contact, and the remaining portion of the semiconductor structure form the cylindrical body.

In some embodiments, forming the semiconductor structure comprises: forming the semiconductor material in the opening by a patterned epitaxial growth process.

In some embodiments, the method further comprises, forming the semiconductor structure comprises: forming the semiconductor material in the opening by a deposition process and a followed recrystallization process.

In some embodiments, forming the cap layer comprises: using an cyclic deposition-etch process to form the cap layer, such that a top surface of the cap layer is lower than a bottom surface of a lowest conductive layer of the memory stack.

In some embodiments, the method further comprises forming a plurality of interconnection structures electrically connected to the top contact, the plurality of conductive layers of the memory stack, and the bottom conductive layer respectively.

In some embodiments, the method further comprises: forming a staircase structure in the memory stack; wherein the interconnection structures electrically connected to the plurality of conductive layers of the memory stack are formed on the staircase structure.

In some embodiments, forming the plurality of interconnection structures comprises: connecting the top contact to a bit line; connecting a top conductive layer of the memory stack is coupled to a word line; connecting the plurality conductive layers other than the top conductive layer of the memory stack to a plurality of plate lines respectively; and connecting the bottom conductive layer to a source line.

In some embodiments, the method further comprises connecting the plurality of plate lines to a common voltage source.

In some embodiments, the method further comprises connecting the plurality of plate lines to a plurality of independent voltage sources.

In some embodiments, forming the memory stack comprises: depositing the plurality of conductive layers, such that each of the plurality of conductive layers of the memory stack has a substantially same first thickness.

In some embodiments, forming the memory stack further comprises: depositing the plurality of dielectric layers, such that each of the plurality of dielectric layers of the memory stack has a substantially same second thickness.

In some embodiments, forming the memory stack further comprises: depositing the plurality of dielectric layers, such that a top dielectric layer of the memory stack has a third thickness that is different from a second thickness of the other dielectric layers of the memory stack.

Another aspect of the present disclosure provides a method for forming a memory structure, comprising: forming a memory cell comprising: forming a cylindrical body configured to store an electrical charge, forming an insulating layer surrounding the cylindrical body, forming a word line contact surrounding a first portion of the insulating layer, the word line contact coupled to a word line, and forming a plurality of plate line contact segments surrounding a second portion of the insulating layer, the plurality of plate line contact segments coupled to a plurality of plate lines respectively; forming a bit line contact coupled to a first end of the cylindrical body of the memory cell, the bit line contact coupled to a bit line; forming a source cap coupled to a second end of the cylindrical body of the memory cell; and forming a source line contact coupled to the source cap, the source line contact coupled to a source line.

In some embodiments, the method further comprises connecting the plurality of plate lines to a common voltage source.

In some embodiments, the method further comprises connecting the plurality of plate lines to a plurality of independent voltage sources.

In some embodiments, the method further comprises doping the source line contact, the source cap, and the bit line contact with a first type of dopant; and doping the cylindrical body with a second type of dopant opposite to the first type of dopant.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself may be patterned and materials added on top of it may also be patterned, or may remain without patterning.

The following examples are illustrative, but not limiting, of the aspects of this disclosure. Other suitable modifications and adaptations of the variety of conditions and parameters normally encountered in the field, and which would be apparent to those skilled in the relevant art(s), are within the spirit and scope of the disclosure.

While specific aspects have been described above, it will be appreciated that the aspects may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary aspects as contemplated by the inventor(s), and thus, are not intended to limit the aspects and the appended claims in any way.

The aspects have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects will so fully reveal the general nature of the aspects that others can, by applying knowledge within the skill of the art, readily modify and/or adapt for various applications such specific aspects, without undue experimentation, without departing from the general concept of the aspects. Therefore, such adaptations and modifications are intended to be within the meaning and range of equivalents of the disclosed aspects, based on the teaching and guidance presented herein.

The breadth and scope of the aspects should not be limited by any of the above-described exemplary aspects, but should be defined only in accordance with the following claims and their equivalents.

What is claimed is:

1. A method for forming a memory structure, comprising:
   forming a bottom conductive layer on a substrate;
   forming a bottom isolation layer on the bottom conductive layer;
   forming a memory stack on the bottom isolation layer, the memory stack comprising a plurality of dielectric layers alternately arranged with a plurality of conductive layers;
   forming an opening penetrating the memory stack and bottom isolation layer to expose the bottom conductive layer;
   forming a cap layer on the bottom conductive layer and filling a first portion of the opening;
   forming a cylindrical body on the cap layer and filing a second portion of the opening;
   forming a top contact on the cylindrical body and filling a third portion of the opening; and
   forming a plurality of interconnection structures to electrically couple the bottom conductive layer, the plurality of conductive layers of the memory stack, and the top contact.

2. The method of claim 1, further comprising:
doping the bottom conductive layer and the cap layer with a first type of dopant.

3. The method of claim 1, further comprising:
before forming the cylindrical body and the top contact, performing an oxidation process to treat exposed surface of the plurality of conductive layers of the memory stack and the bottom conductive layer to form an oxide layer.

4. The method of claim 3, further comprising:
before forming the cylindrical body and the top contact, performing a punch etch to remove the oxide layer on the bottom conductive layer to expose a conductive material of the bottom conductive layer.

5. The method of claim 2, wherein forming the cylindrical body and the top contact comprises:
forming a semiconductor structure on the cap layer to fill the opening;
doping the semiconductor structure with a second type of dopant opposite to the first type of dopant; and
doping a top portion of the semiconductor structure with the first type of dopant, such that the top portion of the semiconductor structure form the top contact, and the remaining portion of the semiconductor structure form the cylindrical body.

6. The method of claim 5, wherein forming the semiconductor structure comprises:
forming the semiconductor structure in the opening by a patterned epitaxial growth process.

7. The method of claim 5, wherein forming the semiconductor structure comprises:
forming the semiconductor structure in the opening by a deposition process and a followed recrystallization process.

8. The method of claim 1, wherein forming the cap layer comprises:
using an cyclic deposition-etch process to form the cap layer, such that a top surface of the cap layer is lower than a bottom surface of a lowest conductive layer of the memory stack.

9. The method of claim 1, further comprising:
forming a staircase structure in the memory stack;
wherein the plurality of interconnection structures electrically coupled to the plurality of conductive layers of the memory stack are formed on the staircase structure.

10. The method of claim 1, wherein forming the plurality of interconnection structures comprises:
coupling the top contact to a bit line;
coupling a top conductive layer of the memory stack a word line;
coupling the plurality conductive layers other than the top conductive layer of the memory stack to a plurality of plate lines respectively; and
coupling the bottom conductive layer to a source line.

11. The method of claim 10, further comprising:
connecting the plurality of plate lines to a common voltage source.

12. The method of claim 10, further comprising:
coupling the plurality of plate lines to a plurality of independent voltage sources.

13. The method of claim 1, wherein forming the memory stack comprises:
depositing the plurality of conductive layers, such that each of the plurality of conductive layers of the memory stack has a substantially same first thickness.

14. The method of claim 13, wherein forming the memory stack further comprises:
depositing the plurality of dielectric layers, such that each of the plurality of dielectric layers of the memory stack has a substantially same second thickness.

15. The method of claim 13, wherein forming the memory stack further comprises:
depositing the plurality of dielectric layers, such that a top dielectric layer of the memory stack has a third thickness that is different from a second thickness of the other dielectric layers of the memory stack.

* * * * *